(12) United States Patent
Manahan et al.

(10) Patent No.: US 10,448,525 B2
(45) Date of Patent: Oct. 15, 2019

(54) MOISTURE CONTROL SYSTEMS FOR ELECTRICAL ENCLOSURES

(71) Applicants: Joseph Michael Manahan, Manlius, NY (US); Jesse Wade Taylor, Baldwinsville, NY (US); Benjamin Avery Freer, Syracuse, NY (US); Stephan P Iannce, Clay, NY (US); Alvah B. Aldrich, Geneva, NY (US); Adam Douglas Ledgerwood, Syracuse, NY (US)

(72) Inventors: Joseph Michael Manahan, Manlius, NY (US); Jesse Wade Taylor, Baldwinsville, NY (US); Benjamin Avery Freer, Syracuse, NY (US); Stephan P Iannce, Clay, NY (US); Alvah B. Aldrich, Geneva, NY (US); Adam Douglas Ledgerwood, Syracuse, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 237 days.

(21) Appl. No.: 15/278,986

(22) Filed: Sep. 28, 2016

(65) Prior Publication Data
US 2017/0092405 A1 Mar. 30, 2017

Related U.S. Application Data

(60) Provisional application No. 62/233,837, filed on Sep. 28, 2015.

(51) Int. Cl.
*H05K 5/02* (2006.01)
*H05K 7/20* (2006.01)

(52) U.S. Cl.
CPC ............. *H05K 5/0213* (2013.01); *H05K 7/20* (2013.01)

(58) Field of Classification Search
CPC ..................................................... H05K 5/0213
See application file for complete search history.

(56) References Cited

U.S. PATENT DOCUMENTS 3,951,131 A * 4/1976 Houfek ................... A47J 27/16
126/369
5,117,869 A * 6/1992 Kolchinsky ......... F16K 31/0613
137/625.65
(Continued)

FOREIGN PATENT DOCUMENTS

WO WO2010045650 4/2010

OTHER PUBLICATIONS

S. Chernyakova, International Search Report and Written Opinion issued in application No. PCT/US2016/054180, completion date Jan. 23, 2017, dated Jan. 26, 2017, 7 pages, Federal Institute of Industrial Property, Moscow, Russia.

*Primary Examiner* — Jonathan Bradford
(74) *Attorney, Agent, or Firm* — King & Spalding LLP

(57) ABSTRACT

A moisture control system for an electrical enclosure can include a control module. The system can also include a drain assembly coupled to the control module, where the drain assembly is disposed, at least in part, within the cavity of the electrical enclosure, where the drain assembly is configured to remove, based on instructions received from the control module, liquid from the cavity to the ambient environment.

19 Claims, 14 Drawing Sheets

(56) References Cited

U.S. PATENT DOCUMENTS

| | | | | |
|---|---|---|---|---|
| 5,897,098 A | * | 4/1999 | Nishinosono | F16H 61/0251 251/129.08 |
| 6,098,644 A | * | 8/2000 | Ichinose | F16H 61/0251 137/1 |
| 6,220,275 B1 | * | 4/2001 | Nishinosono | F16K 31/0606 137/238 |
| 6,619,616 B1 | * | 9/2003 | Sudani | F16K 31/0637 137/596.17 |
| 2002/0020452 A1 | * | 2/2002 | Barger | F16K 47/08 137/887 |
| 2002/0116933 A1 | * | 8/2002 | Chu | H05K 5/0213 62/93 |
| 2003/0019800 A1 | * | 1/2003 | Romanyszyn | B01D 29/117 210/90 |
| 2007/0000564 A1 | | 1/2007 | Jones | |
| 2009/0173639 A1 | | 7/2009 | Ferrari et al. | |
| 2010/0284150 A1 | * | 11/2010 | Manahan | A62C 4/00 361/695 |
| 2013/0085613 A1 | * | 4/2013 | Bester | F24F 11/0001 700/277 |
| 2013/0137358 A1 | | 5/2013 | Manahan et al. | |

\* cited by examiner

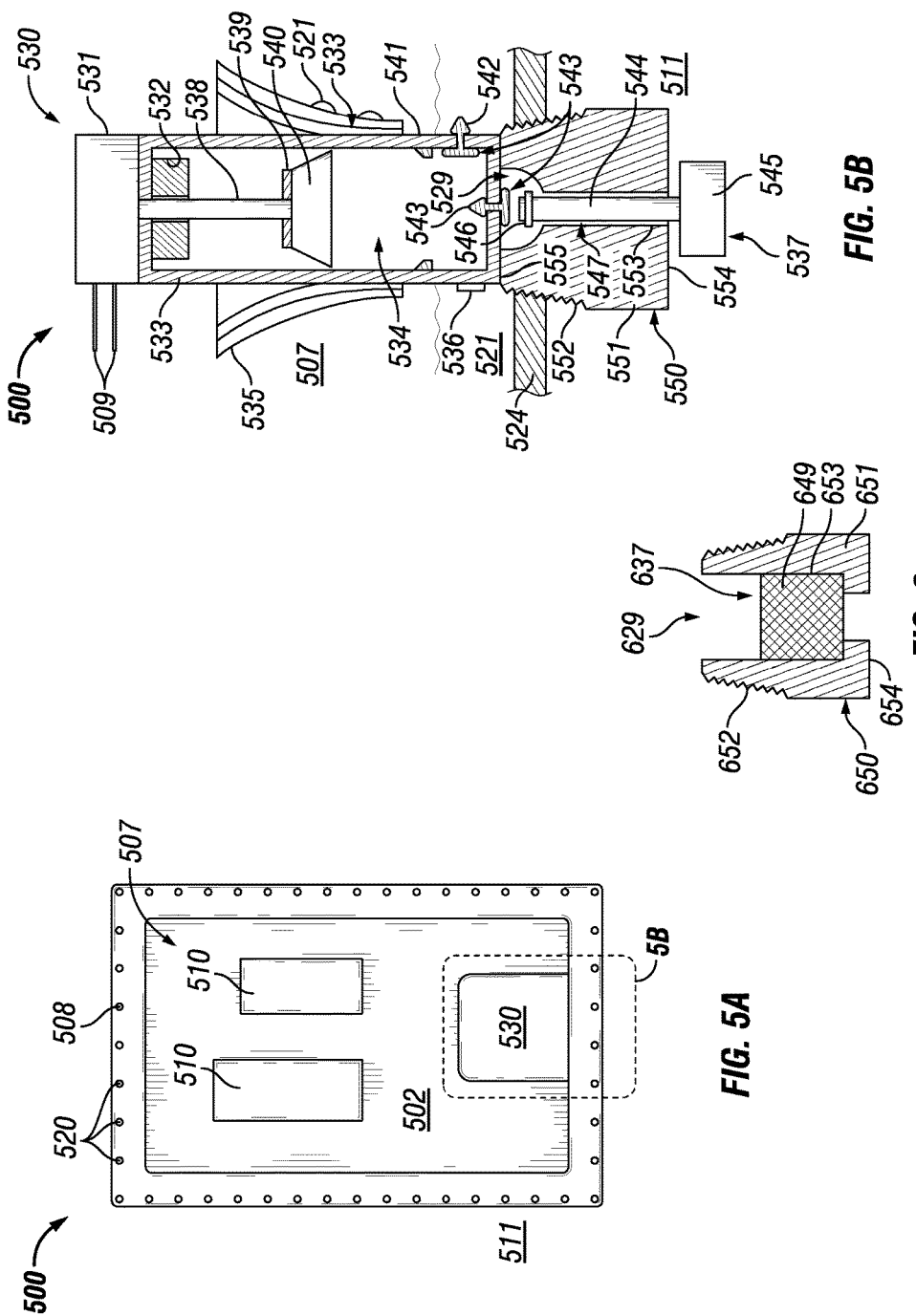

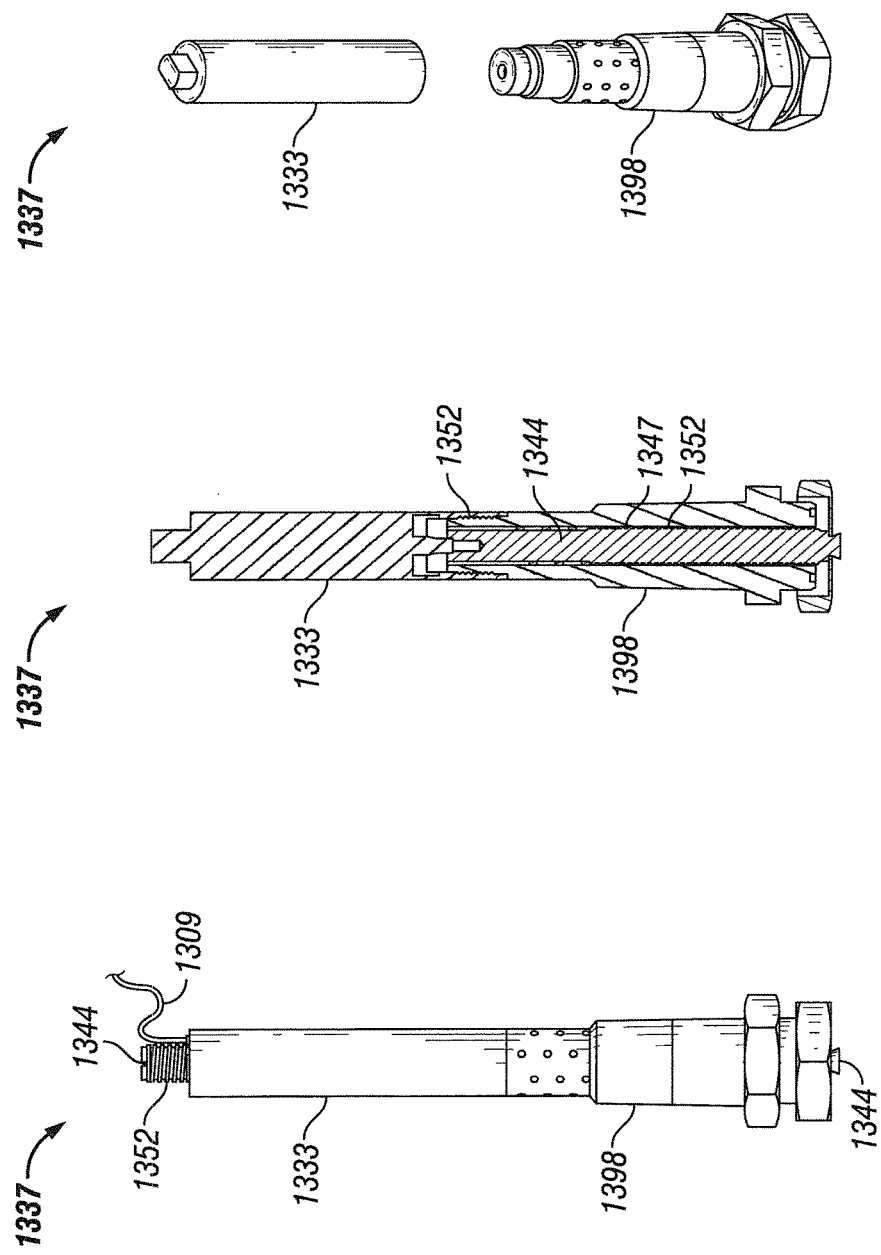

MOISTURE CONTROL SYSTEMS FOR ELECTRICAL ENCLOSURES

CROSS-REFERENCE TO RELATED APPLICATIONS

This application claims priority under 35 U.S.C. § 119 to U.S. Provisional Patent Application Ser. No. 62/233,837, titled "Moisture Control Systems For Electrical Enclosures" and filed on Sep. 28, 2015, the entire contents of which are hereby incorporated herein by reference.

TECHNICAL FIELD

The present disclosure relates generally to controlling an environment within electrical enclosures, and more particularly to systems, methods, and devices for moisture control systems for electrical enclosures.

BACKGROUND

Electrical enclosures are used in a number of applications and have a number of different sizes and configurations. Such electrical enclosures have one or more electrical devices and/or mechanical devices disposed therein. One or more of the mechanical devices can operate based on a change of state of an electrical device. Sometimes, the environments in which these electrical enclosures are located are subject to one or more environmental conditions (e.g., high temperatures, high humidity, moisture) that can be present inside an electrical enclosure. When this occurs, damage can occur to the electrical devices, causing the electrical devices to fail and creating a potential safety concern. Similarly, if a mechanical device corrodes or otherwise fails because of unfavorable environmental conditions within the electrical enclosure, the mechanical device may fail to operate when an electrical device changes state, which can also create a safety concern. In addition, the interior surfaces of the electrical enclosure can become corroded or otherwise damaged.

SUMMARY

In general, in one aspect, the disclosure relates to a moisture control system for an electrical enclosure. The moisture control system can include a control module. The moisture control system can also include a drain assembly coupled to the control module, where the drain assembly is disposed, at least in part, within a cavity formed by the electrical enclosure, where the drain assembly is configured to remove, based on instructions received from the control module, liquid from within the cavity to an ambient environment.

In another aspect, the disclosure can generally relate to an electrical enclosure. The electrical enclosure can include an enclosure body that forms a cavity. The electrical enclosure can also include an enclosure cover coupled to the enclosure body, where the enclosure cover, when coupled to the enclosure body, encloses the cavity. The electrical enclosure can further include a moisture control system disposed, at least in part, within the cavity, where the moisture control system controls at least one condition within the cavity of the electrical enclosure. The moisture control system can include a control module. The moisture control system can also include a drain assembly coupled to the control module, where the drain assembly is disposed, at least in part, within the cavity of the electrical enclosure, where the drain assembly is configured to remove liquid from the cavity to the ambient environment.

In yet another aspect, the disclosure can generally relate to a moisture control system for an electrical enclosure. The moisture control system can include a control module. The moisture control system can also include a vent assembly coupled to the control module, wherein the vent assembly is disposed, at least in part, in a cavity of the electrical enclosure, where the vent assembly is configured to allow, in an open vent state, ambient air to flow therethrough to the cavity, thereby reducing a pressure within the cavity, where the control module operates the vent assembly between a closed vent state and the open vent state.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

FIGS. 5A and 5B show a moisture control system for an electrical enclosure in accordance with certain example embodiments.

FIG. 6 shows a cross-sectional side view of a variation of the moisture control system of FIG. 5B in accordance with certain example embodiments.

FIGS. 13A-13C show various views of another drain assembly of a moisture control system in accordance with certain example embodiments.

DETAILED DESCRIPTION

Figure 1:
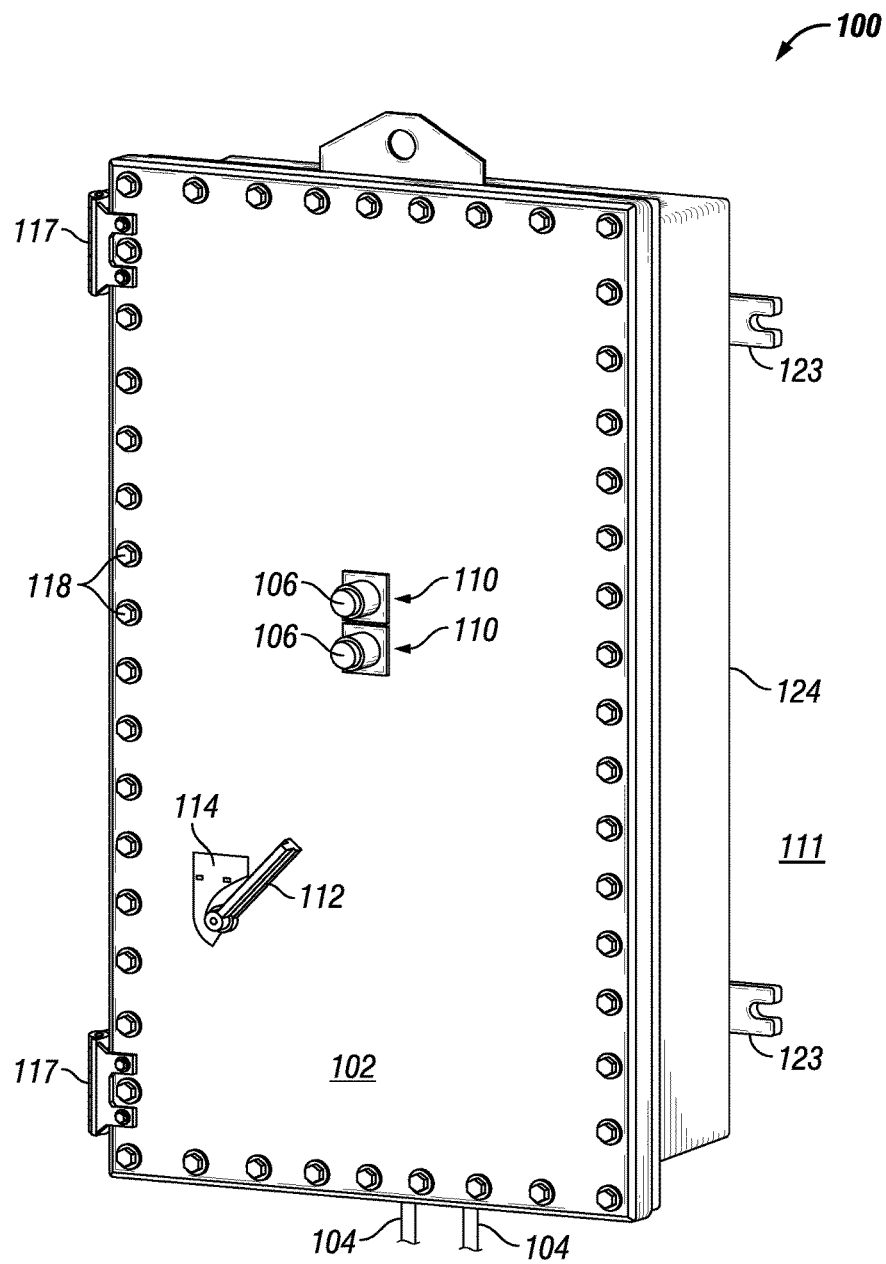
FIG. 1 shows a front perspective view of the exterior of an explosion-proof enclosure in which one or more example embodiments can be implemented.

In general, example embodiments provide systems, methods, and devices for moisture control systems for electrical enclosures. While many of the example moisture control systems described herein are directed for use with electrical enclosures designed to be located in hazardous (e.g., explosive) environments, such embodiments can be used with electrical enclosures that are designed for use in other environments that are not considered hazardous. A user may be any person that interacts with example moisture control systems for electrical enclosures. Examples of a user may include, but are not limited to, an engineer, an electrician, an instrumentation and controls technician, a mechanic, an operator, a consultant, a contractor, and a manufacturer's representative.

Condensation and moisture accumulation are the primary cause of maintenance of equipment (e.g., electrical devices, mechanical devices) located in high humidity environments. While electrical enclosures, which house electrical and/or mechanical devices, offer some degree of protection for and isolation of those devices, problems related to condensation and moisture can still occur within the cavities of electrical enclosures. While example embodiments are directed to controlling moisture within an electrical enclosure, example embodiments can also control one or more conditions (also called environmental conditions) within an electrical enclosure. Such other conditions can include, but are not limited to, temperature, pressure, humidity, and air quality.

In the current art, breathers or drains are disposed in a wall of an electrical enclosure in an attempt to remove condensation and moisture that accumulates in the electrical enclosure. The best performing breathers and drains currently available perform at a flow rate of approximately 22 cc/min (1.52 in$^3$/min). When the electrical enclosure is explosion-proof, the breathers and drains act as explosion-proof weep holes that rely on head pressure within the enclosure to vent. These breathers and drains are largely ineffective, especially in hazardous locations. A major problem with these breathers and drains is dirt, insects, and other debris often clog the breathers and drains, preventing condensation and moisture from escaping the enclosure. In order to free the breathers and drains of debris, frequent maintenance must be performed on the breathers and drains. Realistically, the high degree of maintenance required to keep the breathers and drains free of debris is impractical and occurs infrequently.

Also in the current art, desiccants and heaters are used in electrical enclosures in an attempt to control condensation and moisture. While a desiccant can be effective, it must be frequently replaced. As stated above, from a practical standpoint, this degree of maintenance is too burdensome, and so the desiccant is not replaced often enough to be an effective means of controlling condensation and moisture in an electrical enclosure. While heaters disposed in the cavity of an electrical enclosure can be used to effectively raise the dew point (thus reducing the level of moisture and condensation) in the electrical enclosure, the heat generated by the heaters can diminish the performance and life of electrical devices in the cavity of the electrical enclosure because of the elevated temperature that those electrical devices are exposed to within the cavity.

The moisture control systems for electrical enclosures described herein can be used in place of, or in addition to, devices and/or systems currently used in the art. The moisture control systems for electrical enclosures (or components thereof) described herein can be made of one or more of a number of suitable materials to allow the electrical enclosures to meet certain standards and/or regulations while also maintaining durability in light of the one or more conditions under which the electrical enclosures, including the example moisture control systems, can be exposed. Examples of such materials can include, but are not limited to, aluminum, stainless steel, fiberglass, glass, plastic, ceramic, and rubber.

Example moisture control systems for electrical enclosures, or portions thereof, described herein can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, mounting, fastening, securing, or other similar terms. Such terms are merely meant to distinguish various elements and/or features within a component or device and are not meant to limit the capability or function of that particular element and/or feature. For example, a feature described as a "coupling feature" can couple, mount, secure, fasten, abut against, and/or perform other functions aside from merely coupling.

A coupling feature (including a complementary coupling feature) as described herein can allow one or more components and/or portions of an example moisture control system (e.g., a bushing, a check valve) to become mechanically coupled, directly or indirectly, to another portion of the moisture control system. A coupling feature can include, but is not limited to, a portion of a hinge, an aperture, a recessed area, a protrusion, a clamp, a slot, a spring clip, a tab, a detent, and mating threads. One portion of an example moisture control system can be coupled to a component of the moisture control system by the direct use of one or more coupling features.

In addition, or in the alternative, a portion of an example moisture control system can be coupled to a component of a moisture control system using one or more independent devices that interact with one or more coupling features disposed on a component of the moisture control system. Examples of such devices can include, but are not limited to, a pin, a hinge, a fastening device (e.g., a bolt, a screw, a rivet), a clamp, and a spring. One coupling feature described herein can be the same as, or different than, one or more other coupling features described herein. A complementary coupling feature as described herein can be a coupling feature that mechanically couples, directly or indirectly, with another coupling feature.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

In the foregoing figures showing example embodiments of moisture control systems for electrical enclosures, one or more of the components shown may be omitted, repeated, and/or substituted. Accordingly, example embodiments of moisture control systems for electrical enclosures should not be considered limited to the specific arrangements of components shown in any of the figures. For example, features shown in one or more figures or described with respect to one embodiment can be applied to another embodiment associated with a different figure or description. As a specific example, a sensor device can be used in an example embodiment described below, even though no sensor device is shown or described for that particular embodiment.

As defined herein, an electrical enclosure is any type of cabinet or housing inside of which is disposed one or more electrical devices. Such electrical devices can include, but are not limited to, variable frequency drives (VFDs), controllers, relays (e.g., solid state, electro-mechanical), contactors, breakers, switches, transformers, inverters, converters, fuses, electrical cables, thermo-electric coolers (TECs), heating elements, air moving devices (e.g., fans, blowers), terminal blocks, wire nuts, and electrical conductors. In some cases, an electrical device can generate heat when operating. Electrical devices can also include mechanical components and/or mechanical devices that are controlled by an electrical device. Examples of an electrical enclosure can include, but are not limited to, an electrical connector, a junction box, a motor control center, a breaker cabinet, an electrical housing, a conduit, a control panel, an electrical receptacle, a lighting panel, a lighting device, a relay cabinet, an indicating panel, and a control cabinet.

Example embodiments are designed to control an amount of moisture within an electrical enclosure. Certain example embodiments can be used to keep the moisture (as measured, for example, by relative humidity using sensors within and/or outside the electrical enclosure) that is within an electrical enclosure within a range of values or below a maximum value. In some cases, example embodiments can be used to eliminate substantially all moisture within an electrical enclosure. As such, example embodiments can operate continuously, at regular intervals, when the moisture within an electrical enclosure falls outside a range of values, on-demand from a user, and/or according to some other schedule.

In certain example embodiments, electrical enclosures to which example moisture control systems are coupled are subject to meeting certain standards and/or requirements. For example, the National Electric Code (NEC), the National Electrical Manufacturers Association (NEMA), the International Electrotechnical Commission (IEC), and the Institute of Electrical and Electronics Engineers (IEEE) set standards as to electrical enclosures, wiring, and electrical connections. Use of example embodiments described herein meet (and/or allow a corresponding device to meet) such standards when required. In some (e.g., PV solar) applications, additional standards particular to that application may be met by the electrical enclosures to which example moisture control systems are coupled.

For example, the example moisture control systems, when coupled to an electrical enclosure, can allow the electrical enclosure to meet the NEMA 4X standard. In such a case, the electrical enclosure is constructed to provide a degree of protection to components (e.g., electrical devices) disposed within the electrical enclosure against, at least, corrosion, falling dirt, rain, sleet, snow, ice, windblown dust, splashing water, and hose-directed water. As a specific example, an electrical enclosure with a NEMA 4X rating can provide protection with respect to harmful effects on electrical equipment disposed within the electrical enclosure due to ingress of water. Thus, the example moisture control system that is mechanically coupled to such an electrical enclosure must also meet these standards.

An electrical enclosure that includes an example moisture control system can be located in any type of environment (e.g., indoors, outdoors, under water, in a climate controlled room). In addition, or in the alternative, example moisture control systems can be located in hazardous and/or marine environments. As defined herein, a hazardous location is any location where the enclosure can be exposed to extreme conditions. Extreme conditions can include, but are not limited to, high temperatures, low temperatures, temperature fluctuations, corrosion, humidity, chemicals, vibrations, and dust. More information about hazardous locations and hazardous location enclosures can be found, for example, in Articles 500-506 and Articles 510-517 of the National Electric Code, which is incorporated herein by reference.

Examples of a hazardous location in which example embodiments can be used can include, but are not limited to, an airplane hangar, a drilling rig (as for oil, gas, or water), a production rig (as for oil or gas), a refinery, a chemical plant, a power plant, a mining operation, and a steel mill. A hazardous environment can include an explosion-proof environment, which would require an electrical enclosure with an example moisture control system to meet one or more requirements, including but not limited to flame paths.

An explosion-proof enclosure is a type of hazardous location electrical enclosure. In one or more example embodiments, an explosion-proof enclosure (also known as a flame-proof enclosure) is an electrical enclosure that is configured to contain an explosion that originates inside the enclosure. Further, the explosion-proof enclosure is configured to allow gases from inside the explosion-proof enclosure to escape across joints (also called gaps herein) of the explosion-proof enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, an explosion-proof enclosure is subject to meeting certain standards and/or requirements. For example, NEMA sets standards with which an electrical enclosure must comply in order to qualify as an explosion-proof enclosure. Specifically, NEMA Type 7, Type 8, Type 9, and Type 10 enclosures set standards with which an explosion-proof enclosure within certain hazardous locations must comply. For example, a NEMA Type 7 standard applies to electrical enclosures constructed for indoor use in certain hazardous locations. Hazardous locations may be defined by one or more of a number of authorities, including but not limited to the National Electric Code (e.g., Class 1, Division I) and UL (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes (e.g., greater than 100 in$^3$) may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Example embodiments of moisture control systems for electrical enclosures will be described more fully hereinafter with reference to the accompanying drawings, in which example embodiments of moisture control systems for electrical enclosures are shown. Moisture control systems for electrical enclosures may, however, be embodied in many different forms and should not be construed as limited to the example embodiments set forth herein. Rather, these example embodiments are provided so that this disclosure will be thorough and complete, and will fully convey the scope of moisture control systems for electrical enclosures to those of ordinary skill in the art. Like, but not necessarily the same, elements (also sometimes called components) in the various figures are denoted by like reference numerals for consistency.

Terms such as "first", "second", "top", "bottom", "side", "width", "length", "inner", and "outer" are used merely to distinguish one component (or part of a component or state of a component) from another. Such terms are not meant to denote a preference or a particular orientation, and are not meant to limit embodiments of moisture control systems for electrical enclosures. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a front perspective view of the exterior of an example explosion-proof enclosure 100 in which one or more example embodiments can be implemented. Referring now to FIG. 1, the example of an explosion-proof enclosure 100 in a closed position (i.e., the enclosure cover 102 is secured to the enclosure body 124) is shown in an ambient environment 111 (e.g., a hazardous environment). The enclosure cover 102 can be secured to the enclosure body 124 by a number of fastening devices 118 located at a number of points around the perimeter of the enclosure cover 102. In one or more example embodiments, a fastening device 118 may be one or more of a number of fastening devices, including but not limited to a bolt (which may be coupled with a nut), a screw (which may be coupled with a nut), and a clamp. In addition, one or more optional hinges 117 can be secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 117. In one or more example embodiments, there are no hinges, and the enclosure cover 102 can be completely separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials. In one or more example embodiments, on the end of the enclosure body 124 opposite the enclosure cover 102, one or more mounting brackets 123 are affixed to the exterior of the enclosure body 124 to facilitate mounting the enclosure 100. Using the mounting brackets 123, the enclosure 100 may be mounted to one or more of a number of surfaces and/or elements, including but not limited to a wall, a control cabinet, a cement block, an I-beam, and a U-bracket.

The enclosure cover 102 can optionally include one or more features that allow for user interaction while the enclosure 100 is sealed in the closed position. As shown in FIG. 1, one or more electrical devices 110 (e.g., indicating lights 106) may be located on the enclosure cover 102. The enclosure cover 102 may also include a switch handle 112 (a type of mechanical device, which can be considered an electrical device 110 because the switch handle 112 is coupled to an electrical device 110, as discussed below) that allows a user to operate a switch (shown in FIG. 2 below) located inside the explosion-proof enclosure 100 while the explosion-proof enclosure 110 is closed. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the explosion-proof enclosure 100.

There can be one or more conduits 104 that are coupled to a wall 124 of the explosion-proof enclosure 100. Each conduit 104 can have one or more electrical conductors (e.g., electrical cables) disposed therein, where one end of the electrical conductors are electrically coupled to one or more electrical devices 110 disposed within the explosion-proof enclosure 100, as shown below with respect to FIG. 2.

Figure 2:
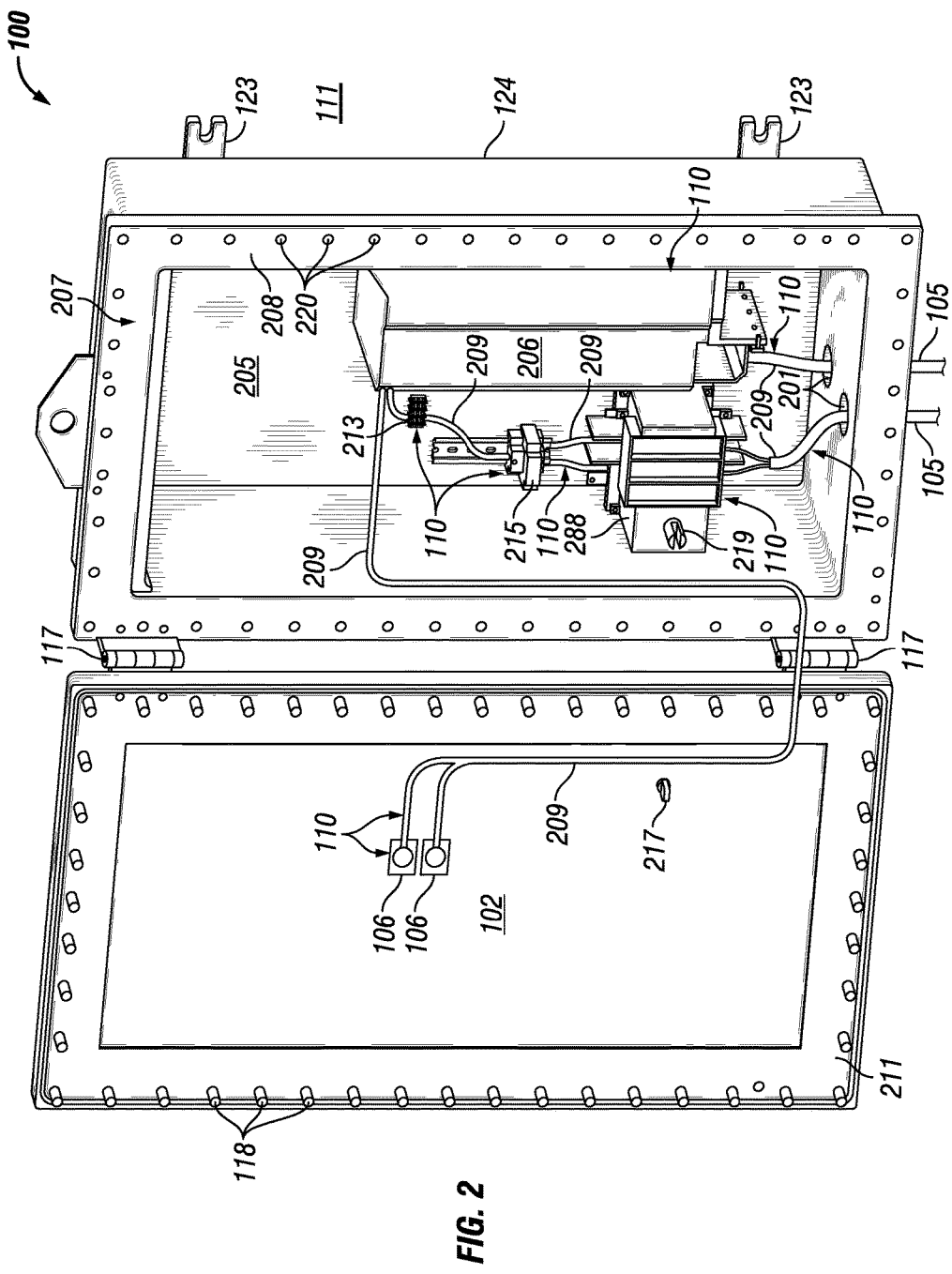
FIG. 2 shows a front perspective view of the interior of an explosion-proof enclosure in which one or more example embodiments can be implemented.

FIG. 2 shows a front perspective view of an example of the interior of the explosion-proof enclosure 100 of FIG. 1 in which one or more example embodiments can be implemented. Referring to FIGS. 1 and 2, the explosion-proof enclosure 100 is in the open position because the enclosure cover 102 is not secured to the enclosure body 124. The hinges 117 attached to the left side of the enclosure body 124 are also attached to the left side of the enclosure cover 102, which is swung outward from the enclosure body 124. Because the explosion-proof enclosure 100 is in the open position, the components of the explosion-proof enclosure 100 are visible to a user.

As described above with respect to FIG. 1, the enclosure body 124 includes two or more mounting brackets 123. In addition, in one or more example embodiments, the enclosure body 124 includes an enclosure engagement surface 208 (also called a flange), against which an enclosure engagement surface 211 (also called a flange) of the enclosure cover 102 abuts against when the explosion-proof enclosure 100 is in the closed position. A number of coupling features 220 (in this case, apertures) are shown around the enclosure engagement surface 208, where each of the coupling features 220 are configured to receive a coupling feature 118 (in this case, a fastening device, such as a bolt) that traverses through corresponding coupling features (e.g., apertures) in the enclosure cover 102.

In one or more example embodiments, the explosion-proof enclosure 100 of FIG. 2 includes a mounting plate 205 that is affixed to the back of the inside of the explosion-proof enclosure 100. The mounting plate 205 may be configured to receive one or more components (e.g., electrical devices 110, mechanical devices) such that the one or more components are affixed to the mounting plate 205. The mounting plate 205 may include one or more apertures configured to receive coupling features (e.g., bolts) that may be used to affix a component to the mounting plate 205. The mounting plate 205 may be made of any suitable material, including but not limited to the material of the enclosure body 124. In one or more example embodiments, some or all of the one or more components may be mounted directly to an inside wall of the explosion-proof enclosure 100 rather than to the mounting plate 205.

In this case, the electrical devices 110 mounted to the mounting plate 205 within the cavity 207 of the explosion-proof enclosure 100 include a VFD 206, a switch 288, a relay 215, and a terminal block 213. The switch 288 can include a switch coupling 219 that couples to a switch handle shaft 217 that extends from the switch handle 112 when the explosion-proof enclosure is in the closed position. Electrical conductors 209 are used to electrically couple one electrical device 110 to at least one other electrical device 110 within the cavity 207 of the explosion-proof enclosure 100. Each conduit 104 is disposed within an entry hole 201 disposed in the bottom wall of the enclosure body 124 of the explosion-proof enclosure 100.

Figure 4:
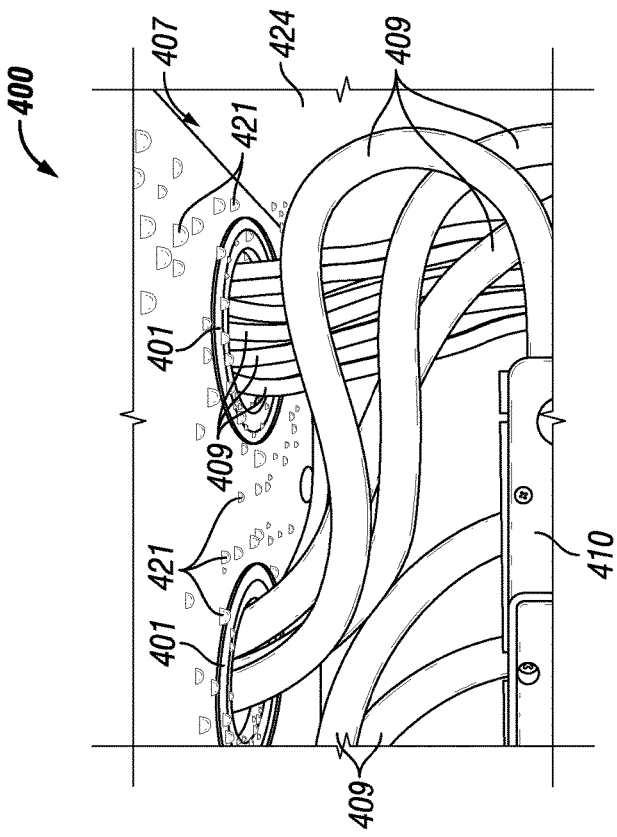
FIGS. 3 and 4 show electrical enclosures that show the effects of electrical components that are exposed to moisture.
Figure 3:
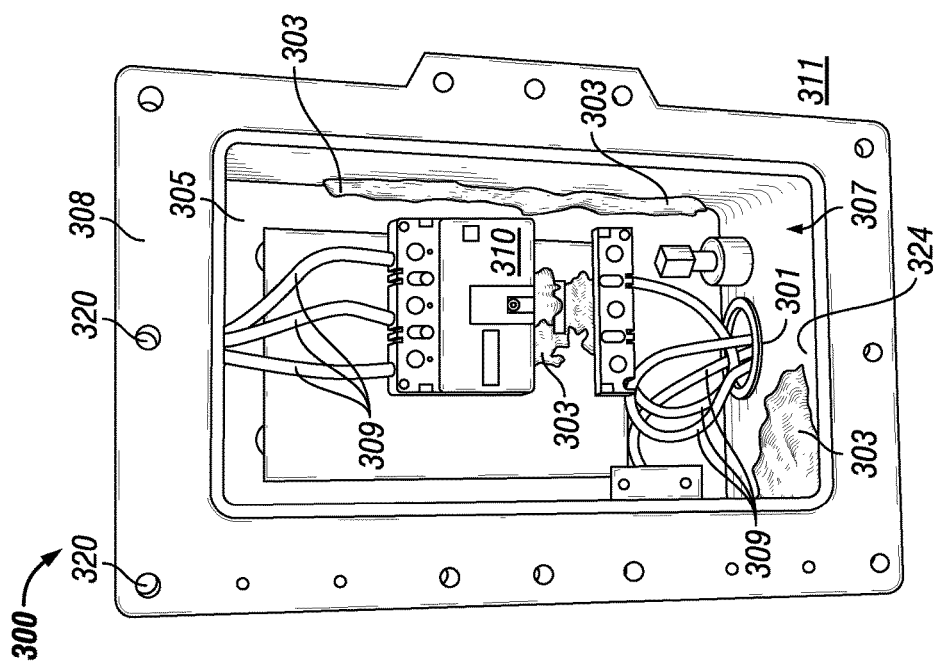

FIGS. 3 and 4 show electrical enclosures that show the effects of electrical components that are exposed to moisture. Specifically, FIG. 3 shows a front view of an open electrical enclosure 300, and FIG. 4 shows a detailed view of a front view of another open enclosure 400. Referring to FIGS. 1-4, the electrical enclosure 300 of FIG. 3 has a number of electrical devices 310, which includes a circuit breaker and a number of electrical cables 309, disposed in the cavity 307. Because the electrical enclosure 300 does not have a moisture control system, corrosion 303 has developed on various parts of the electrical enclosure 300, including but not limited to the electrical devices 310, the mounting plate 305, the walls of the enclosure body 324, the entry hole 301, the coupling features 320, and the enclosure engagement surface 308.

Corrosion 303 can cause one or more of a number of adverse conditions to electrical and mechanical devices within the cavity 307 of the electrical enclosure 300, as well as to the electrical enclosure 300 itself. For example, the corrosion 303 can cause one or more mechanical devices and/or mechanical components of one or more electrical devices 310 disposed in the cavity 307 to seize, As another example, the corrosion 303 of wiring terminal connections can cause overheating at those terminal connections, which can degrade/destroy an associated electrical device 303, cause a fire, and/or create some other adverse condition within the cavity 307. As yet another example, when the corrosion 303 collects on the enclosure engagement surface 308, and when the electrical enclosure 300 is an explosion-proof enclosure, the flame path formed between the enclosure engagement surface 308 and the enclosure cover can be compromised, leading to a loss in explosion-proof integrity and creation of a safety hazard.

The electrical enclosure 400 of FIG. 4 also has a number of electrical devices 410, which includes a circuit breaker and a number of electrical cables 409, disposed in the cavity 407. Because the electrical enclosure 400 does not have a moisture control system, liquid 421 has accumulated in the cavity 407. The liquid 421 can be any type of liquefied compound, including but not limited to water. The liquid 421 can take any of a number of forms, including but not limited to beads (e.g., condensation) of water formed by excessive moisture, a puddle or pool of accumulated liquid, and a running stream. In this case, liquid 421 is condensation (e.g., beads of water formed by excessive moisture) that has formed on the electrical devices 410, the walls of the enclosure body 424, and the entry hole 401. Over time, the liquid 421 forms corrosion within the cavity 407 of the electrical enclosure 400. In addition, the liquid 421 can be electrically conductive and cause a ground fault when the liquid 421 accumulates in sufficient quantities at various locations in the cavity 407.

FIGS. 5A and 5B show a moisture control system for an electrical enclosure in accordance with certain example embodiments. Specifically, FIG. 5A shows a front view of an open electrical enclosure 500 that includes a moisture control system 530. FIG. 5B shows a cross-sectional side view of the moisture control system 530. Referring to FIGS. 1-5B, the electrical enclosure 500 of FIG. 5A has a number of electrical devices 510 as well as at least a portion of the moisture control system 530 disposed in the cavity 507.

In this case, the moisture control system 530 of FIGS. 5A and 5B is a pump assembly. Specifically, the moisture control system 530 has a housing 533 that forms a cavity 534. A control module 531, powered using electrical conductors 509, generates power and control signals for operating the moisture control system 530. In such a case, the control module 531 drives a piston 540, using an electromagnet 532, a guide rod 538, and a magnetic surface 539, up and down within the cavity 534. One or more stops 541 are used to limit the downward travel of the piston 540 within the cavity 534.

As liquid 521 collects at the bottom of the cavity 507 of the electrical enclosure 500, gravity forces the liquid 521 through the check valve 542 disposed on the side and toward the bottom of the housing 533 and into the cavity 534. In such a case, when the amount of liquid 521 accumulates above the point on the housing where the check valve 542 is located, the check valve 542 allows the liquid 521 to enter the cavity 534. When the piston 540 operates, liquid 521 in the cavity 534 is pushed from the cavity 534, out of the housing 533 through a check valve 543 in the bottom of the housing 533. In some cases the check valve 542 and/or the check valve 543 is not included, and so the liquid 521 merely passes through one or more apertures in the housing 533 using, at least in part, gravity.

The piston 540 can be designed to operate at low pressures. In other words, the piston 540 can operate without creating a sucking pressure (or a minimal amount of sucking pressure) to draw liquid 521 outside the housing 533 into the cavity 534. Instead, gravity and natural pressure differentials created by the accumulation of liquid 521 outside the housing 533 proximate to the check valve 542 (as well as, in some cases, a minimal amount of sucking pressure crated by movement of the piston 540 in the housing 533) allows the liquid 521 to enter the cavity 534, in some cases regardless of the operation of the piston 540.

Alternatively, the piston 540 can be designed to operate by creating a sucking pressure relative to outside the housing 533. This variation can be useful, for example, if the liquid 521 is more spotted (rather than a continuous level of fluid shown in FIG. 5B). In such a case, the sucking pressure opens the check valve 542 and draws any liquid 521 proximate to the check valve 542 into the cavity 534.

When the liquid 521 is forced out of the cavity 534 through the check valve 543 by the piston 540 and/or gravity, the liquid 521 enters an upper portion of a chamber 529 of a bushing 550. The bushing 550 can be similar to bushings currently disposed within walls of electrical enclosures. In this case, the bushing 550 is disposed in an aperture in the bottom wall of the enclosure body 524. If the electrical enclosure 500 is a type of hazardous enclosure (e.g., an explosion-proof enclosure), then the bushing 550 can have one or more features (e.g., mating threads 552) to help the electrical enclosure 500 meet applicable standards (e.g., form a proper flame path between the enclosure body 524 and the bushing 550) for the enclosure for its hazardous environment.

The chamber 529 of the bushing 550 can extend along the entire height of the body 551 of the bushing 550. In such a case, the chamber 529 can be defined by an inner surface 553 of the body 551, and the height of the body 551 can be defined by a top surface 555 and a bottom surface 554. Within at least a portion (in this case, the lower portion) of the chamber 529 can be disposed a shaft 544 of a drain assembly 537, where the shaft 544 has a width (e.g., diameter) that is slightly less than the width of the lower portion of the chamber 529. A gap 547 results between the shaft 544 and the inner surface 553 of the bushing 550. If the electrical enclosure 500 is explosion-proof, then the gap 547 can be a flame path.

The drain assembly 537 (or portions thereof) can be stationary relative to the bushing 550. Alternatively, the drain assembly 537 (or portions thereof) can move within the chamber 529. When the shaft 544 of the drain assembly 537 moves up and down within the chamber 529, the movement can help remove dust and other debris that can inhibit or stop the flow of liquid 521 along the gap 547 to the ambient environment 511. In other words, example embodiments can be self-cleaning, which greatly reduces maintenance requirements and increases the effectiveness of the moisture control system 530. In certain example embodiments, the piston 540 and related components of the moisture control system 530 are not included. In such a case, the control module 531 directly controls movement the shaft 544 of the drain assembly 537 to perform a self-cleaning function.

At the distal end of the shaft 544 can be disposed an end piece 545 of the drain assembly 537. The end piece 545 can have a width that is wider than the width of the lower portion of the chamber 529. In such a case, the gap 547 can continue between the top surface of the end piece 545 and the bottom surface 554 of the bushing 550. At the proximal end of the shaft 544 can be disposed a stabilizer 546 that is disposed in the upper portion of the chamber 529. The stabilizer 546 can help maintain the position of the shaft 544 relative to the chamber 529 so that the gap 547 between the shaft 544 and the bushing 550 is substantially maintained along the length of the gap 547. In certain example embodiments, there can be more than one stabilizer, and the stabilizer 546 can be disposed along a different portion of the shaft 544.

In some cases, the shaft 544 can be extended upward into the cavity 534 so that the shaft 544 is directly coupled to the piston 540 and/or the guide rod 538. In such a case, the moisture control system 530 can be self-cleaning. Further, in such an embodiments, the check valve 543 can be integrated with a portion of the shaft 544. Alternatively, one or more of a number of other configurations can be achieved so that the liquid 521 that is collected into the cavity 534 is forced out of the moisture control system 530 and into the ambient environment 511.

UL 1203 has design restrictions for rotating electrical devices operating below 100 rpm, and different design restrictions for rotating electrical devices operating above 100 rpm. Therefore, the example moisture control system 530 is configured to meet the requirements of UL 1203 and/or any other applicable standards. For example, the control module 531 can operate using no more than 24 V direct current (DC) and/or no more than 1 W of power. The example moisture control system 530 can be configured to operate continuously (regardless of whether the electrical enclosure 500 is open or closed), randomly, at regular intervals, based on the occurrence of some event (measurement of a sensor device 536 that exceeds and/or falls below a threshold value), or at some other interval. In certain example embodiments, the example moisture control system 530 can achieve at least five times the flow rate in draining condensation when compared to traditional breathers and/or drains.

When one or more sensor devices 536 are used, the measurements taken by the sensor devices 536 can be received by the control module 531 to help the control module 531 determine when to operate one or more components of the moisture control system 530. Examples of a sensor device 536 can include, but are not limited to, a temperature sensor, a pressure sensor, a photocell, a water level detector, and a humidity sensor. Examples of parameters that a sensor device 536 can measure can include, but are not limited to, humidity, temperature, dew point, fluid level, and pressure. In this case, the sensor device 536 detects an excess of moisture (exceeds a threshold value) in the cavity 507 and sends a signal to the control module 531. When the control module 531 receives this signal from the sensor device 536, the control module 531 operates the piston 540. Subsequently, when the moisture level detected by the sensor module 536 falls below a threshold value, the sensor module 536 sends a signal to the control module 531, which causes the control module 531 to stop the piston 540 from operating.

The moisture control system 530 can be used to indicate actual maintenance required for some or all of the explosion-proof enclosure 500. Further, regardless of whether one or more sensor devices 536 are used, the moisture control system 530 can not only determine when one or more components of the moisture control system 530 should operate, but the parameters measured by the sensor devices 536 and/or the operational characteristics (e.g., frequency of operation, duration of operation) can be used for predictive diagnostics and maintenance planning.

In certain example embodiments, the moisture control system 530 can include an optional heat sink 535 that is cooled using a thermo-electric cooler (TEC) (not shown). In such a case, the TEC can help facilitate the conversion of moisture in the cavity 507 to condensation, which accumulates as liquid 521 at the bottom of the cavity 507 with the assistance of gravity. The heat sink 535 can be integral with the housing 533, as shown in FIG. 5B. Alternatively, the heat sink 535 can be located remotely from the housing 533. The heat sink 535 can be used to ensure proper performance of the moisture control system 530 and achieve additional collection and removal of liquid 521 from within the cavity 507 of the electrical enclosure 500.

In certain example embodiments, the control module 531 forces the piston 540 to move up and down within the housing 533 when there is no liquid 521 in the cavity 534. In such a case, the movement of the piston 540 can serve a self-cleaning function for the moisture control system 530 to prevent debris (e.g., dust) from accumulating and inhibiting the operation of the moisture control system 530. When the shaft 544 is coupled to the piston 540, the bushing 550 and drain assembly 537 (or portions thereof) can be involved in the self-cleaning function.

In certain example embodiments, the moisture control system 530 can include one or more sealing devices (e.g., gasket, o-ring, silicone) (not shown). For example, a sealing device can be disposed around the shaft 544 at its proximal and/or distal end. In such a case, the sealing device can be used to prevent debris from collecting in at least a portion of the moisture control system 530 when the moisture control system 530 is not in use.

FIG. 6 shows a cross-sectional side view of a variation of the moisture control system of FIG. 5B in accordance with certain example embodiments. Specifically, FIG. 6 shows an alternative drain assembly 637 integrated with the bushing 650. In this case, the drain assembly 637 merely consists of a sintered filter 649 that is disposed within at least a portion of the channel 629 formed by the inner surface 653 of the body 651 of the bushing 650. In such a case, if the electrical enclosure is located in a hazardous environment, the sintered filter 649 can be designed to provide the proper flame path while still allowing condensation to be forced to the ambient environment 511 by the piston 540. The bushing 650 of FIG. 6 can be substantially the same as the bushing 550 of FIG. 5B, except that the bushing 650 of FIG. 6 can have one or more features (e.g., a bottom surface 654 of the body 651 that extends further inward, as shown in FIG. 6) that keep the sintered filter 649 retained in a certain position within the channel 629. In other words, the bushing 650 and associated components of FIG. 6 can be used as a substitute for the bushing 550 and associated components of FIGS. 5A and 5B.

Figure 7B:
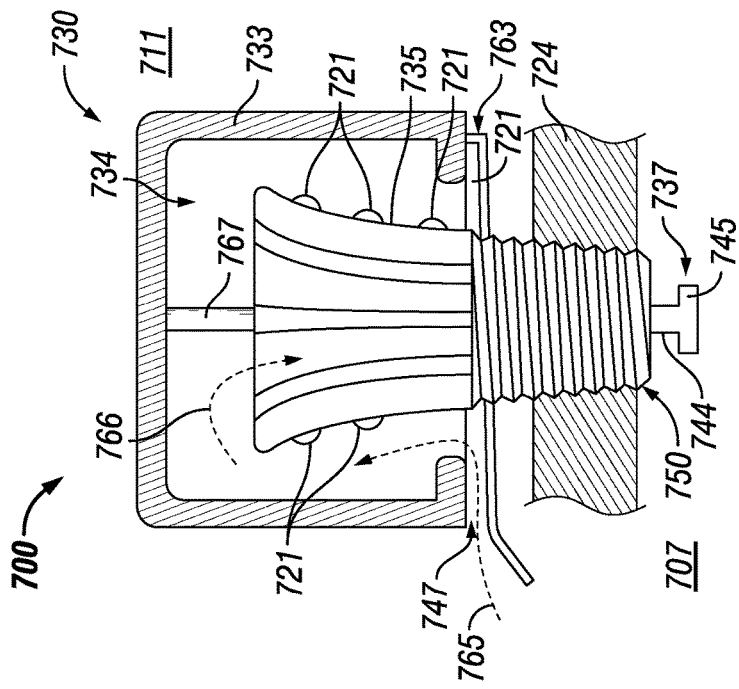
FIGS. 7A and 7B show another moisture control system for an electrical enclosure in accordance with certain example embodiments.
Figure 7A:
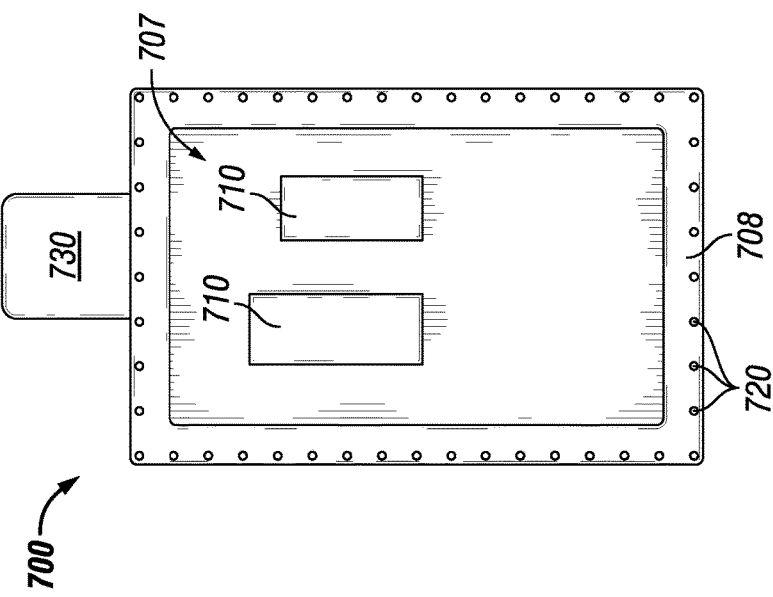

FIGS. 7A and 7B show another moisture control system 730 for an electrical enclosure 700 in accordance with certain example embodiments. Specifically, FIG. 7A shows a front view of an open electrical enclosure 700 that includes a moisture control system 730. FIG. 7B shows a cross-sectional side view of the moisture control system 730. Referring to FIGS. 1-7B, the electrical enclosure 700 of FIG. 7A has a number of electrical devices 710 as well as a portion of the moisture control system 730 disposed in the cavity 707. The majority of the moisture control system 730 is located outside the cavity 707 in the ambient environment 711.

In this case, the moisture control system 730 of FIGS. 7A and 7B is a breather. Specifically, the moisture control system 730 has a housing 733 that forms a cavity 734, where the housing 733 is disposed in the ambient environment 711. The housing 733 has at least one opening 747 toward the bottom through which humid air 765 from the ambient environment 711 flows into the cavity 734 of the housing 733. Disposed within the housing 733 is a heat sink 735 that is cooled using a thermo-electric cooler. In other words, the heat sink 735 of the moisture control system 730 of FIG. 7B can be substantially similar to the heat sink 535 of the moisture control system 530 of FIG. 5B.

In this way, the heat sink 735 can be used to collect liquid 721 (e.g., water) that is generated when the humid air 765 flows near the heat sink 735. When this occurs, as the humid air 765 flows to the top of the cavity 734 of the housing 733 and toward the top of the heat sink 735, less humid air 766 can flow into and/or through the heat sink 735. An anchor 767 can extend from the top of the housing 733 to the heat sink 735 to secure the heat sink 735 relative to the housing 733. In certain example embodiments, a drip collector 763 can be attached to the bottom of the housing 733 to collect liquid 721 that falls under the influence of gravity along the heat sink 735 and collects on the drip collector 763. The drip collector 763 can be angled downward toward the opening 747 so that the liquid 721 can be directed, using gravity, out of the cavity 734 of the housing 733 and into the ambient environment 711.

The less humid air 766, after traveling through the heat sink 735, travels through the drain assembly 737 to reach the cavity 707 of the electrical enclosure 700. Otherwise, the bushing 750 and drain assembly 737 of FIG. 7B can be substantially the same as the bushing 550 and drain assembly 537 of FIG. 5B or the bushing 650 and drain assembly 637 of FIG. 6. For example, the shaft 744 and the end piece 745 of the drain assembly 737 of FIG. 7B can be stationary or reciprocating with respect to the bushing 750. If the drain assembly 737 is reciprocating, then the drain assembly 737 can be self-cleaning. In some cases, the bushing (e.g., bushing 750) can be part of the drain assembly (e.g., drain assembly 737).

Figure 8C:
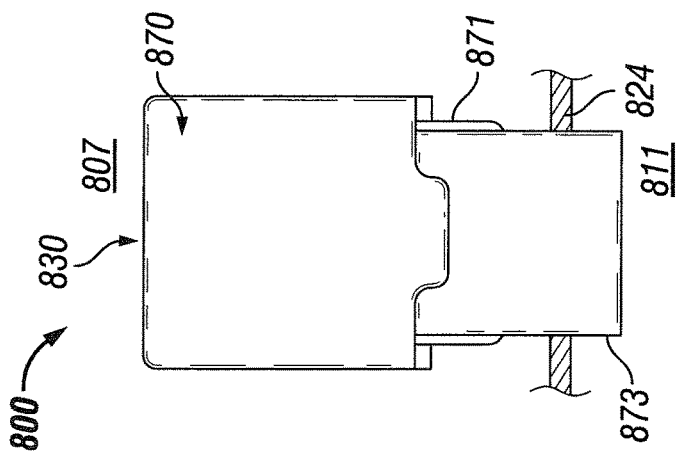
FIGS. 8A-8C show yet another moisture control system for an electrical enclosure in accordance with certain example embodiments.
Figure 8B:
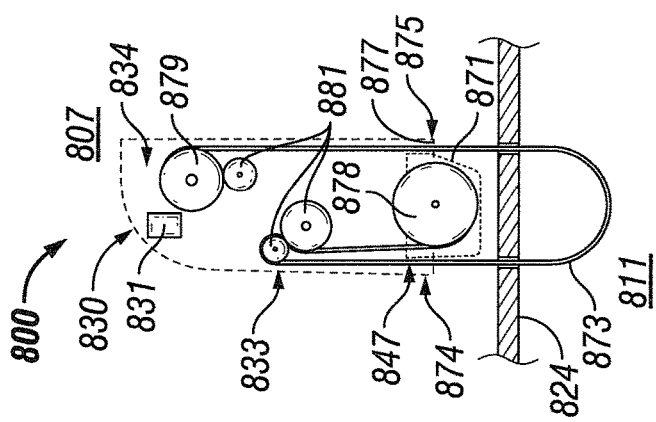
Figure 8A:
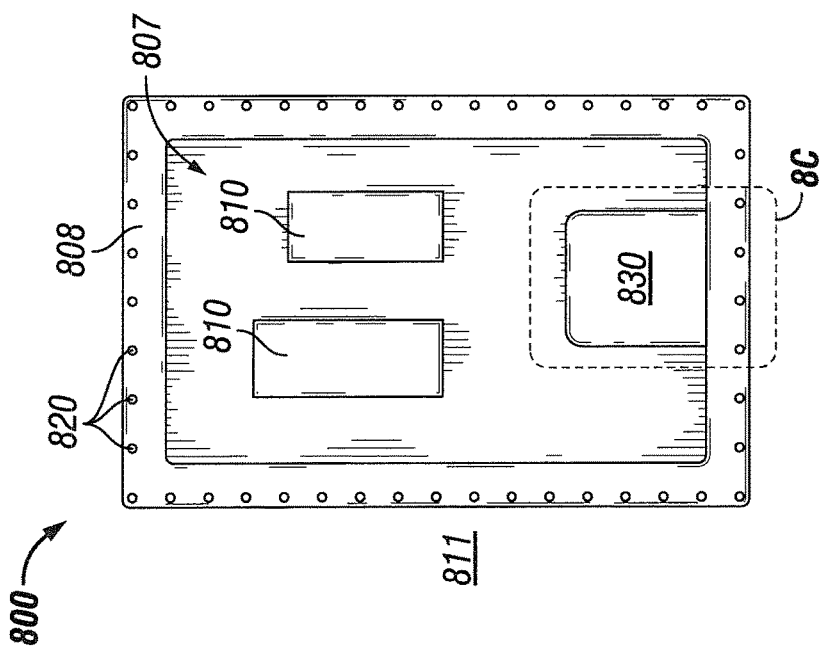

FIGS. 8A-8C show yet another moisture control system 830 for an electrical enclosure 800 in accordance with certain example embodiments. Specifically, FIG. 8A shows a front view of an open electrical enclosure 800 that includes a moisture control system 830. FIG. 8B shows a cross-sectional side view of the moisture control system 830. FIG. 8C shows a rear view of the moisture control system 830. Referring to FIGS. 1-8C, the electrical enclosure 800 of FIG. 8A has a number of electrical devices 810 as well as at least a portion of the moisture control system 830 disposed in the cavity 807.

In this case, the moisture control system 830 of FIGS. 8A-8C uses an absorption process. Specifically, the moisture control system 830 has a housing 833 that forms a cavity 834. The cavity 834 is substantially closed at the bottom of the housing 833 by a bottom cap 871. A gap 847 can exist between the front bottom 874 of the housing 833 and the bottom cap 871. Similarly, a gap 877 can exist between the rear bottom 875 of the housing 833 and the bottom cap 871. The gap 847 and the gap 877 can be wide enough to allow a medium 873 to be disposed and to move therebetween. The medium 873 can be any material that absorbs moisture when positioned outside the cavity 834 of the housing 833 and within the cavity 807 of the electrical enclosure 800. In addition, the medium 873 can be any material that releases moisture when positioned outside the cavity 834 of the housing 833, outside the cavity 807 of the electrical enclosure 800, and within the ambient environment 811.

Within the cavity 834 of the housing 833 can be disposed feeder roll 878 and a collection roll 879, where the feeder role 878 releases the medium 873 toward the cavity 807 of the electrical enclosure 800, and the collection roll 879 gathers the medium 873 after returning from the ambient environment 811. In addition, one or more of a number of other guides 881 can be disposed in the cavity 834 of the housing 833 to ensure that the medium 873 is properly rotated through the process. A control module 831 can be used to control the movement of one or more guides 881, the feeder roll 878, and/or the collector roll 879. The control module 831 can be positioned within the cavity 834 of the housing 833 or at any other location in or proximate to the electrical enclosure 800.

Figure 9A:
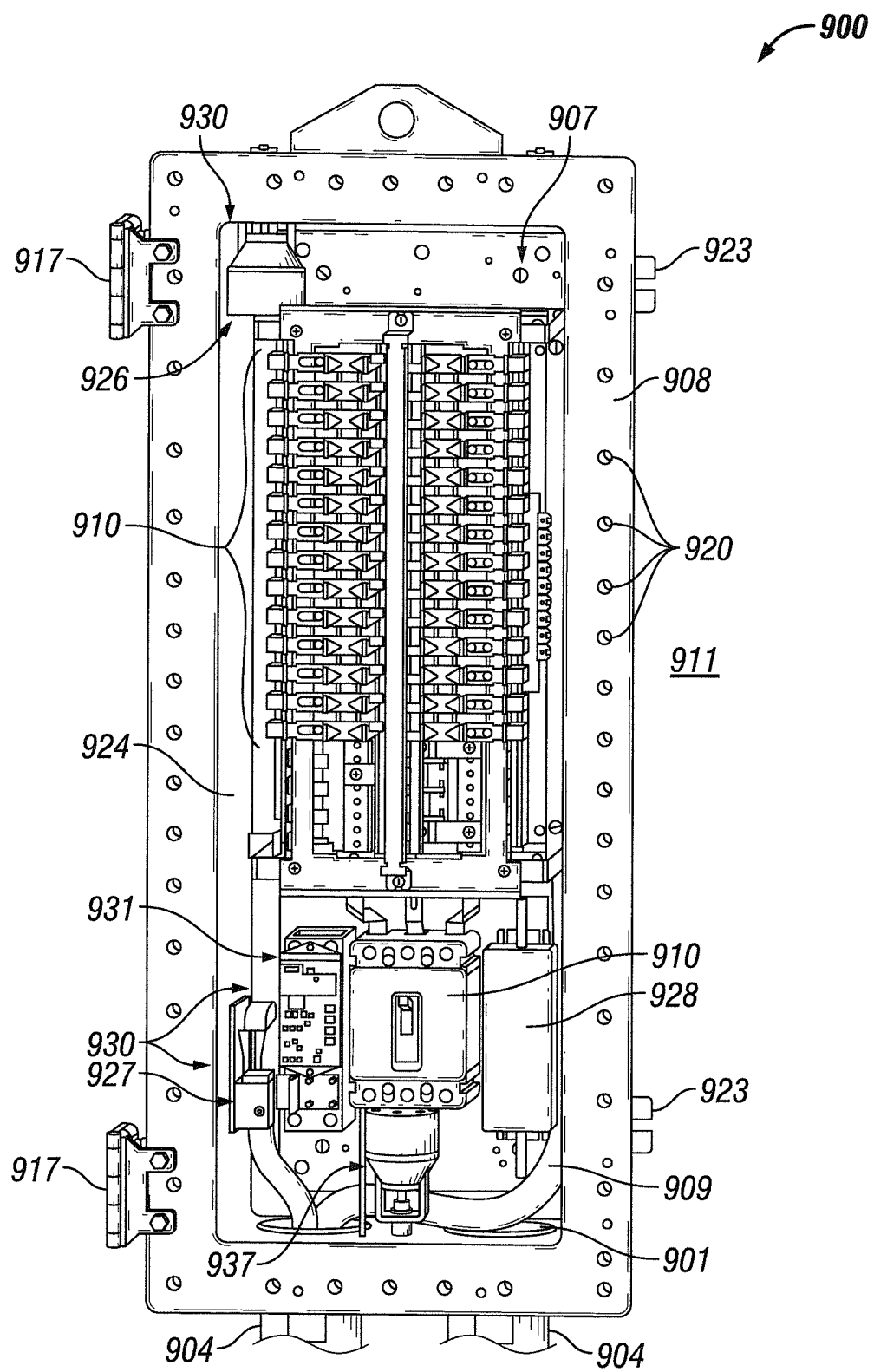
FIGS. 9A and 9B show still another moisture control system for an electrical enclosure in accordance with certain example embodiments.
Figure 9B:
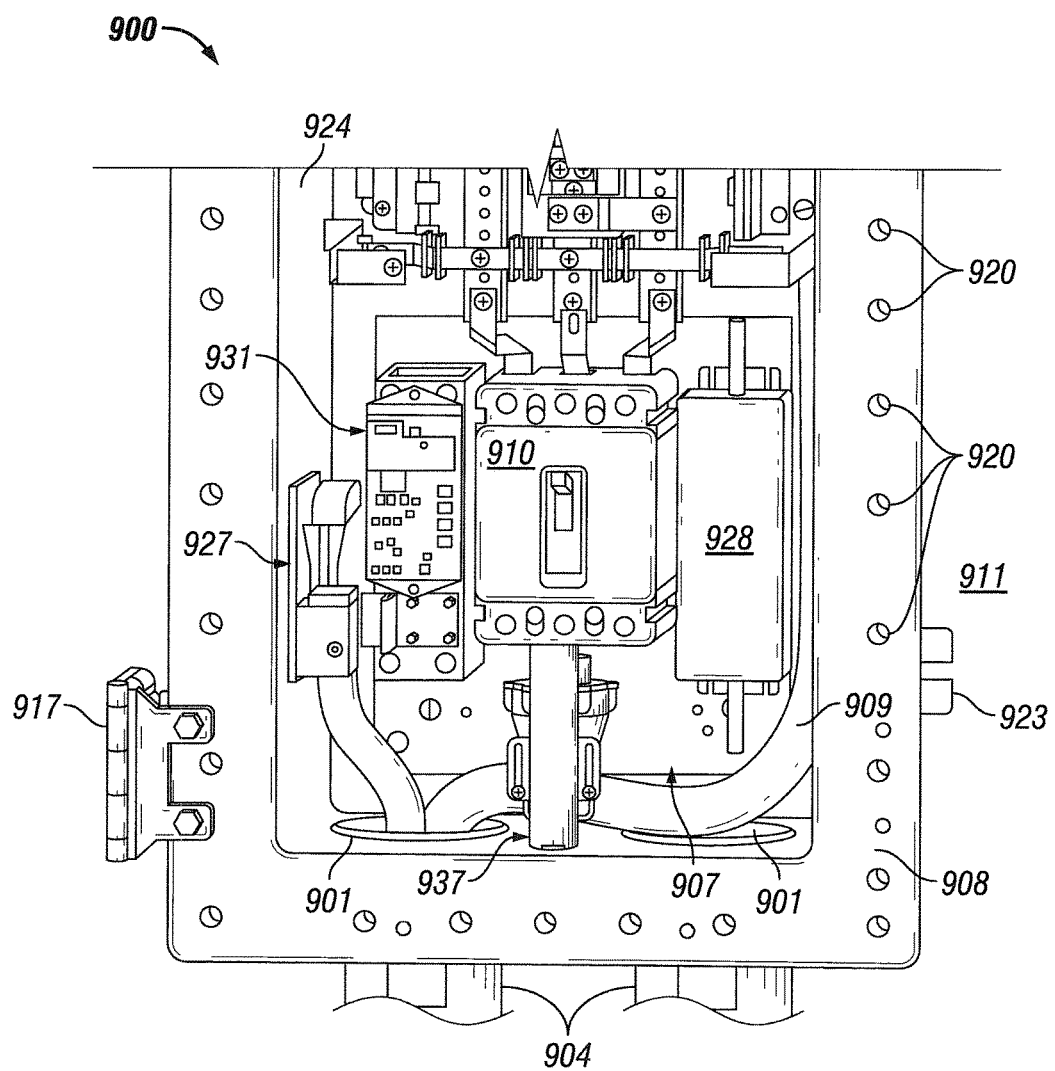
Figure 11:
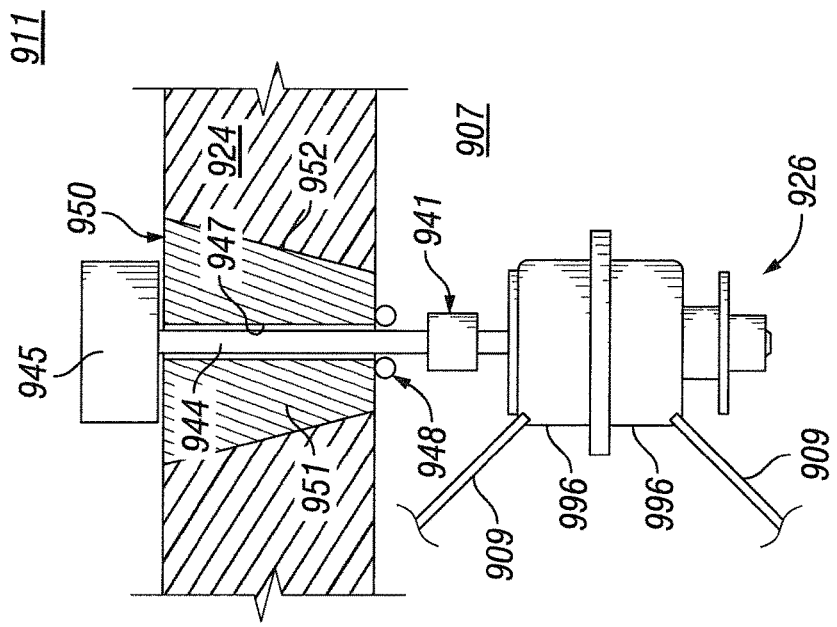
FIG. 11 shows a front view of the vent assembly of the moisture control system of FIGS. 9A and 9B in accordance with certain example embodiments.
Figure 10:
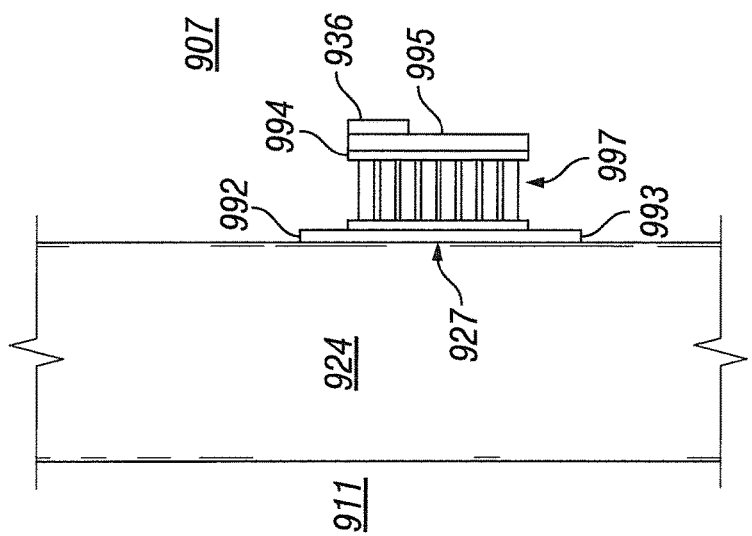
FIG. 10 shows a side view of the thermo-electric cooler of the moisture control system of FIGS. 9A and 9B in accordance with certain example embodiments.
Figure 12B:
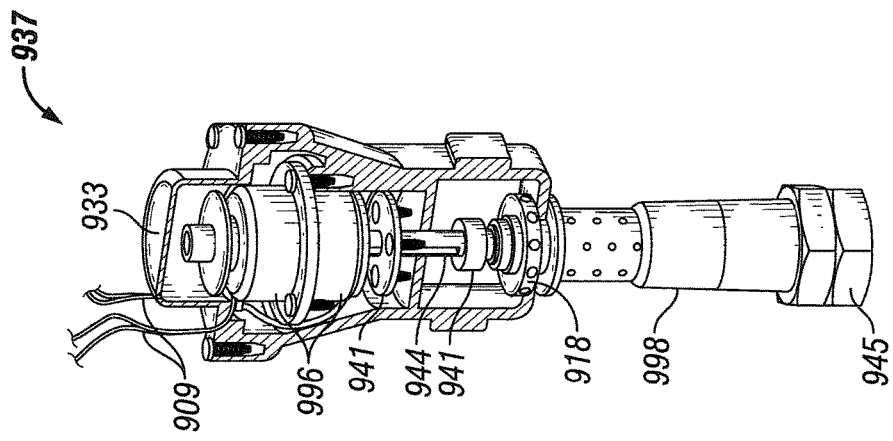
FIGS. 12A and 12B show various views of the drain assembly of the moisture control system of FIGS. 9A and 9B in accordance with certain example embodiments.
Figure 12A:
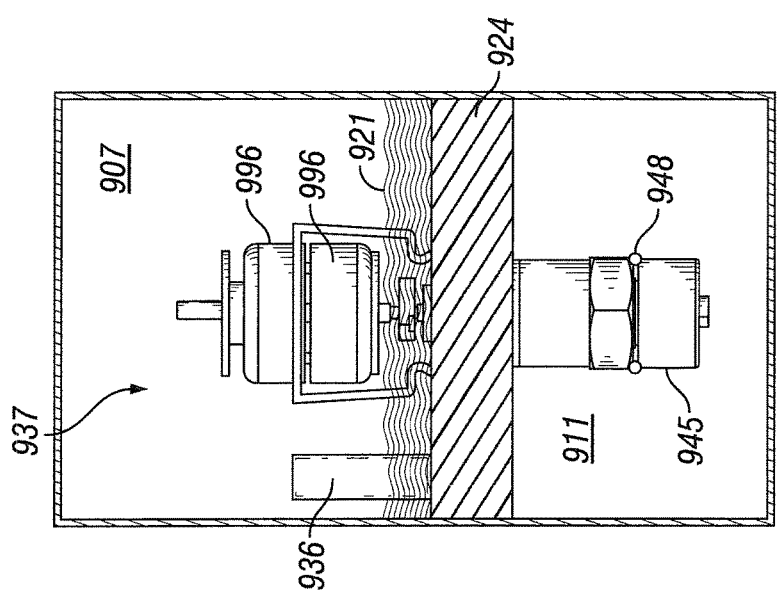

FIGS. 9A and 9B show still another moisture control system 930 for an electrical enclosure 900 in accordance with certain example embodiments. Specifically, FIG. 9A shows a front view of the entire electrical enclosure 900, and FIG. 9B shows a front view of the lower half of the electrical enclosure 900. FIG. 10 shows a side view of the thermoelectric cooler 927 (TEC 927) of the moisture control system 930 of FIGS. 9A and 9B in accordance with certain example embodiments. FIG. 11 shows a front view of the vent assembly 926 of the moisture control system 930 of FIGS. 9A and 9B in accordance with certain example embodiments. FIGS. 12A and 12B show various views of the drain assembly 937 of the moisture control system 930 of FIGS. 9A and 9B in accordance with certain example embodiments. Specifically, FIG. 12A shows a front view of the drain assembly 937. FIG. 12B shows a front-side semi-cross-sectional perspective view of the drain assembly 937.

Referring to FIGS. 1-12B, the electrical enclosure 900 of FIGS. 9A and 9B includes a number of electrical devices 910 (e.g., circuit breakers, bus bars, electrical cables 909, a power supply 928) and the moisture control system 930 disposed within the cavity 907 of the electrical enclosure 900. The moisture control system 930 in this case includes the vent assembly 926 disposed along the top of the cavity 907, the TEC 927, the drain assembly 937 disposed at the bottom of the cavity 907, and a control module 931.

In this case, the moisture control system 930 of FIGS. 9A-12B uses an active drain and vent system. Specifically, the moisture control system 930 includes the TEC 927, the vent assembly 926, and the drain assembly 937 working in concert with each other. The TEC 927 of FIG. 10 is coupled to an inner surface of an outer wall of the enclosure body 924 and includes one or more thermo-electric coolers (TECs), where each TEC includes one or more thermo-electric cells 997 that are sandwiched between a cool plate 994 and a hot plate 993. Each TEC transfers heat from air in the cavity 907 of the electrical enclosure 900 into the outer wall of the enclosure body 924.

Optionally, disposed between the hot plate 993 and the inner surface of the outer wall of the enclosure body 924 can be disposed a thermal interface material 992, which can be used to provide continuity between uneven surfaces of the hot plate 993 and/or the inner surface of the outer wall of the enclosure body 924 for increased thermal transfer between the hot plate 993 and the inner surface of the outer wall of the enclosure body 924. With or without the thermal interface material 992, the hot plate 993 is in thermal communication with the inner surface of the outer wall of the enclosure body 924. When the TEC is activated, the enclosure body 924 provides enough thermal mass to maintain a relatively low temperature at the hot plate 993.

The cold plate 994 can be exposed directly to the cavity 907 of the electrical enclosure 900. Alternatively, as shown in FIG. 10, a cold sink 995 (e.g., a hydro-phobic coating, a metal layer) can be disposed over some or all of the cold plate 994. The cold sink 995 can be used to prevent the cold plate 994 from allowing condensation that collects on the cold plate 994 to freeze. In some cases, the cold sink 995 can be used to have condensation that accumulates on the cold plate 994 (or the cold sink 995) be repelled by the cold sink 995.

In certain example embodiments, the TEC 927 can include a sensor device 936 (e.g., a negative temperature coefficient (NTC) thermistor) can be used to measure a parameter (e.g., a temperature) within the cavity 907 of the electrical enclosure 900. For example, the sensor device 936 shown in FIG. 10 is attached to the cold sink 995 and can measure the temperature of the cold plate 994. In such a case, the temperature of the cold plate 994 can be important to maintain below the dew point and above freezing to ensure proper operation of the TEC 927.

In some cases, the TEC 927 can include one or more other components (e.g., an air moving device, such as a diaphragm pump, a fan, or a blower) to provide air movement (e.g., forced convection) in the cavity 907 of the electrical enclosure 900 to ensure that the moist air within the cavity 907 is moved toward the TEC 927. When the TEC 927 is placed against a thermal component (e.g., a heat sink, the enclosure body 924), the TEC 927 lowers the temperature of the thermal component (at least locally), which can enable the condensation of moisture (to form liquid 921) from the air within the cavity 907 of the electrical enclosure 900 with little to no increase in air temperature within the cavity 907 of the electrical enclosure 900.

When the thermal component is cooled by the TEC 927, convective air currents can result within the cavity 907 of the electrical enclosure 900. When this occurs, the entire air volume of the cavity 907 passes across the thermal component, resulting in the dehumidification of all (or substantially all) of the air within the cavity 907 and the accumulation of liquid 921 on or near the thermal component. In certain example embodiments, an air moving device (e.g., a fan, a blower) can be installed within the cavity 907 of the electrical enclosure 900 to further ensure all air passes across the thermal component that is cooled by the TEC 927.

In some cases, the power polarity of the TEC 927 can be reversed, which heats (at least locally) the thermal component to which the TEC 927 is affixed. This application could be useful for situations where the ambient environment 911 in which the electrical enclosure 900 is disposed has very low temperatures. In such a case, the TEC 927 can be used to heat the cavity 907 of the electrical enclosure 900 and thereby heat up the electrical devices 910 to a temperature that approaches the lower specification limit for the electrical equipment 910. In such conditions, the removal of liquid 921 from within the cavity 907 of the electrical enclosure 900 would be of negligible concern.

The vent assembly 926 of FIG. 11 can include one or more solenoids 996 (or functional equivalents) that create a push and/or pull motion of a shaft 944. Power can be provided to the solenoids 996 through the electrical wires 909 by any of a number of power sources, including but not limited to the power supply 928 and the power module of the control module, as described below with respect to FIG. 14. At least a portion of the shaft 944 of the vent assembly 926 of FIG. 11 is disposed within the channel of a bushing 950, which itself is disposed within an aperture of a wall of the enclosure body 924. The range of motion of the shaft 944 of the vent assembly 926 can be limited by the end piece 945 disposed on the end of the shaft 944 in the ambient environment 911 in one direction, and by the stop 941 disposed on the shaft 944 within the cavity 907 in the other direction. In some cases, the stop 941 can act as a joint between the shaft 944 of the solenoids 996 and a shaft 944 for the drain portion disposed in the aperture of the wall of the enclosure body 924.

The vent assembly 926 (which can include the bushing 950) of FIG. 11 can be substantially the same as the drain assemblies and bushings described above with respect to FIGS. 5B-7C. The vent assembly 926 is designed in this case to allow ambient air from the ambient environment 911 to enter into the cavity 907 of the electrical enclosure 900 so that liquid 921 can be drained through drain assembly 937 more quickly. Without a vent assembly 926, a form of vacuum is created within the cavity 907 of the electrical enclosure 900, which inhibits any liquid 921 that accumulates within the cavity 907 from flowing through the drain assembly 937. The vent assembly 926 and the drain assembly 937 have the added benefit of lowering the pressure within the cavity 907 of the electrical enclosure 900. This added benefit can be important, for example, when the electrical enclosure 900 is an explosion-proof enclosure. In such a case, if an explosion occurs within the cavity 907 of the electrical enclosure 900, then the vent assembly 926 and the drain assembly 937, by naturally lowering the pressure within the cavity 907, reduce the risk of a catastrophic result stemming from the explosion.

While the vent assembly 926 of FIG. 11 is disposed in the top (rather than the bottom) of the enclosure body 924, the vent assembly 926 can be disposed at any place relative to the enclosure body 924 and/or the cover of the electrical enclosure 900. Further, there can be multiple vent assemblies 926 and/or multiple drain assemblies 937 within the electrical enclosure 900. In some embodiments, the vent assembly 926 can include a filter and/or other similar screening component or configuration that prevents contaminants (e.g., water, dirt) from the ambient environment 911 from entering the cavity 907 of the electrical enclosure 900.

An optional sealing device 948 (e.g., an o-ring, silicone, a gasket) can be disposed around part of the shaft 944 of the drain assembly 937. In such a case, the sealing device 948 can control (e.g., reduce, prevent) the transfer of air, water, debris, and/or other materials through the gap 947 between the shaft 944 and the bushing 950. Each solenoid 996 can be powered, controlled, and/or physically supported by one or more electrical conductors 909. If there are multiple solenoids 996, as shown in FIG. 11, one or more solenoids 996 can be separated by a divider. A solenoid 996 can include a spring or other type of automatic return.

The drain assembly 937 of FIGS. 12A and 12B can include one or more solenoids 996 (or functional equivalents) that create a push and/or pull motion of a shaft 994. Power can be provided through the electrical wires 909 to the solenoids 996 by any of a number of power sources, including but not limited to the power supply 928 and the power module of the control module, as described below with respect to FIG. 14. The solenoids 996 can be enclosed by a housing 933, as shown in FIG. 12B. In this case, there is no separate bushing with the drain assembly 937. Instead, the shaft 944 is disposed within a drain body 998 of the drain assembly 937, and the drain body 998 is disposed within an aperture of a wall of the enclosure body 924. One or more fastening devices 918 (in this case, a locking nut) can be used to help secure the drain assembly 937 (or portions thereof) within the cavity 907 of the electrical enclosure 900. Other than the description set forth above, the drain assembly 937 of FIGS. 12A and 12B can be substantially the same as the drain assemblies described above with respect to FIGS. 5B-7C.

An optional sealing device 948 (e.g., a damming device, an o-ring, silicone, a gasket) can be disposed around part of the shaft 944 of the drain assembly 937. Each solenoid 996 can be powered, controlled, and/or physically supported by one or more electrical conductors 909. If there are multiple solenoids 996, as shown in FIGS. 12A and 12B, one or more solenoids 996 can be separated by a divider. A solenoid 996 can include a spring or other type of automatic return. The design of the example drain assembly 937 allows liquid 921 (e.g., water) from the cavity 907 to be removed from the ambient environment 911 while preventing contaminants (e.g., water, dirt, high humidity air which will condense once inside the enclosure) from the ambient environment 911 from entering the cavity 907 of the electrical enclosure 900.

The drain assembly 937 can also include or be controlled (directly or indirectly) by one or more sensor devices 936. For example, the sensor device 936 of FIG. 12A can be a capacitive water level sensor that can detect whether there is standing water 921 within the cavity 907 at the bottom of the electrical enclosure 900. As with the moisture control system 530 described above with respect to FIGS. 5A and 5B, the moisture control system 930 can include a control module 931 that receives the measurements of the sensor devices 936 of FIGS. 10 and 12A (and/or any other sensor devices of the moisture control system 930) and causes one or more components (e.g., a solenoid 996) of the moisture control system 930 to operate. Examples of other sensor devices that can be used with the moisture control system 930 can include, but are not limited to, a temperature sensor and a humidity sensor. In such a case, the control module of the moisture control system 930 can determine whether dehumidification within the cavity 907 of the electrical enclosure 900 is needed.

In certain example embodiments, the control module 931 can operate in one or more of a number of modes. Examples of such modes can include, but are not limited to, open, closed, moisture removal, and active cleaning. To be more specific, in an active cleaning mode, the vent assembly 926 is opened (moved from a closed state to an open state) by the control module 931, and the drain assembly 937 is cycled up and down (moved between an open state and a closed state) at some predetermined rate or interval by the control module 931. In such a case, the active cleaning mode can be terminated under one or more of a number of conditions. Examples of such conditions can include, but are not limited to, when the level of condensation 921 in the cavity 907 of the electrical enclosure 900 is below a threshold value and the humidity within the cavity 907 of the electrical enclosure 900 is below a threshold value, and when the level of condensation 921 in the cavity 907 of the electrical enclosure 900 is below a threshold value and the humidity within the cavity 907 of the electrical enclosure 900 is above a threshold value.

In a closed mode, the vent assembly 926 and the drain assembly 937 are both maintained in a closed state by the control module 931. The closed mode can be implemented when, for example, the humidity within the cavity 907 of the electrical enclosure 900 is below a threshold value and when the temperature within the cavity 907 of the electrical enclosure 900 is above freezing. If the humidity within the cavity 907 of the electrical enclosure 900 rises above a threshold value when the control module 931 of the moisture control system 930 is in the closed mode, the control module 931 can change to another mode (e.g., the moisture mode) based on one or more factors, including but not limited to passage of time and a change in a parameter (e.g., temperature) measured by a sensor device 936.

In a moisture mode, the vent assembly 926 and the drain assembly 937 are both maintained in a closed state by the control module 931 to limit airflow into the cavity 907 of the electrical enclosure 900. At this time, the TEC 927 can be activated by the control module 931 to pull moisture from the air within the cavity 907 of the electrical enclosure 900. During the time, sensor devices 936 can be used (for example, by the control module 931) to monitor the humidity of the air within the cavity 907 of the electrical enclosure 900 and the temperature of at least a portion (e.g., the cold plate 994) of the TEC 927. When the temperature of the cold plate 994 falls below a threshold temperature (e.g., freezing) for some period of time (e.g., instantaneously, for at least 60 seconds), the TEC 927 is turned off by the control module 931. The TEC 927 can be active in both closed and open modes of the control module 931. During periods when humidity and temperatures are low, the TEC 927 can receive reverse polarity power, based on instructions from the control module 931, so that the TEC 927 generates heat instead of cold within the cavity 907 of the electrical enclosure 900. In such a case, when moisture within the cavity 907 is not a concern but the reliable operation of electrical devices 910 (and also mechanical devices) within the cavity 907 can be a concern, the TEC 927 can help ensure operation of electrical devices 910 within the cavity 907.

The moisture removal mode of the control module 931 can be terminated under one or more of a number of conditions. Examples of such conditions can include, but are not limited to, when the humidity within the cavity 907 of the electrical enclosure 900 falls below a threshold value (in which case, the closed mode of the control module 931 can begin), when the air temperature drops below a threshold value (e.g., freezing) (in which case, the open mode of the control module 931 can begin), and when standing water 921 is detected in the cavity 907 of the electrical enclosure 900 (in which case, the active cleaning mode of the control module 931 can begin).

In an open mode, the vent assembly 926 and the drain assembly 937 are both opened by the control module 931. The open mode can be implemented when, for example, the air temperature within the cavity 907 of the electrical enclosure 900 is below a threshold value (e.g., freezing) and/or if the humidity within the cavity 907 of the electrical enclosure 900 is below a threshold value (e.g., approximately zero). If the humidity within the cavity 907 of the electrical enclosure 900 rises above a threshold value when the moisture control system 930 is in the open mode, the control module 931 can change to another mode (e.g., the closed mode).

FIGS. 13A-13C show an alternative drain assembly 1337 of a moisture control system in accordance with certain example embodiments. Specifically, FIG. 13A shows a side view of the drain assembly 1337. FIG. 13B shows a cross-sectional side view of the drain assembly 1337. FIG. 13C shows an exploded side view of the drain assembly 1337. The drain assembly 1337 of FIGS. 13A-13C can be substantially the same as the drain assembly 937 of FIGS. 9A-12B, except as described below. Referring to FIGS. 1-13C, the drain assembly 1337 of FIGS. 13A-13C is more streamlined relative to the drain assembly 937 of FIGS. 9A-12B. The housing 1333 can couple to the drain body 1398 to form a substantially seamless housing that encloses the one or more solenoids (hidden from view), most of the shaft 1344, and the gap 1347 (flame path 1347).

Figure 14:
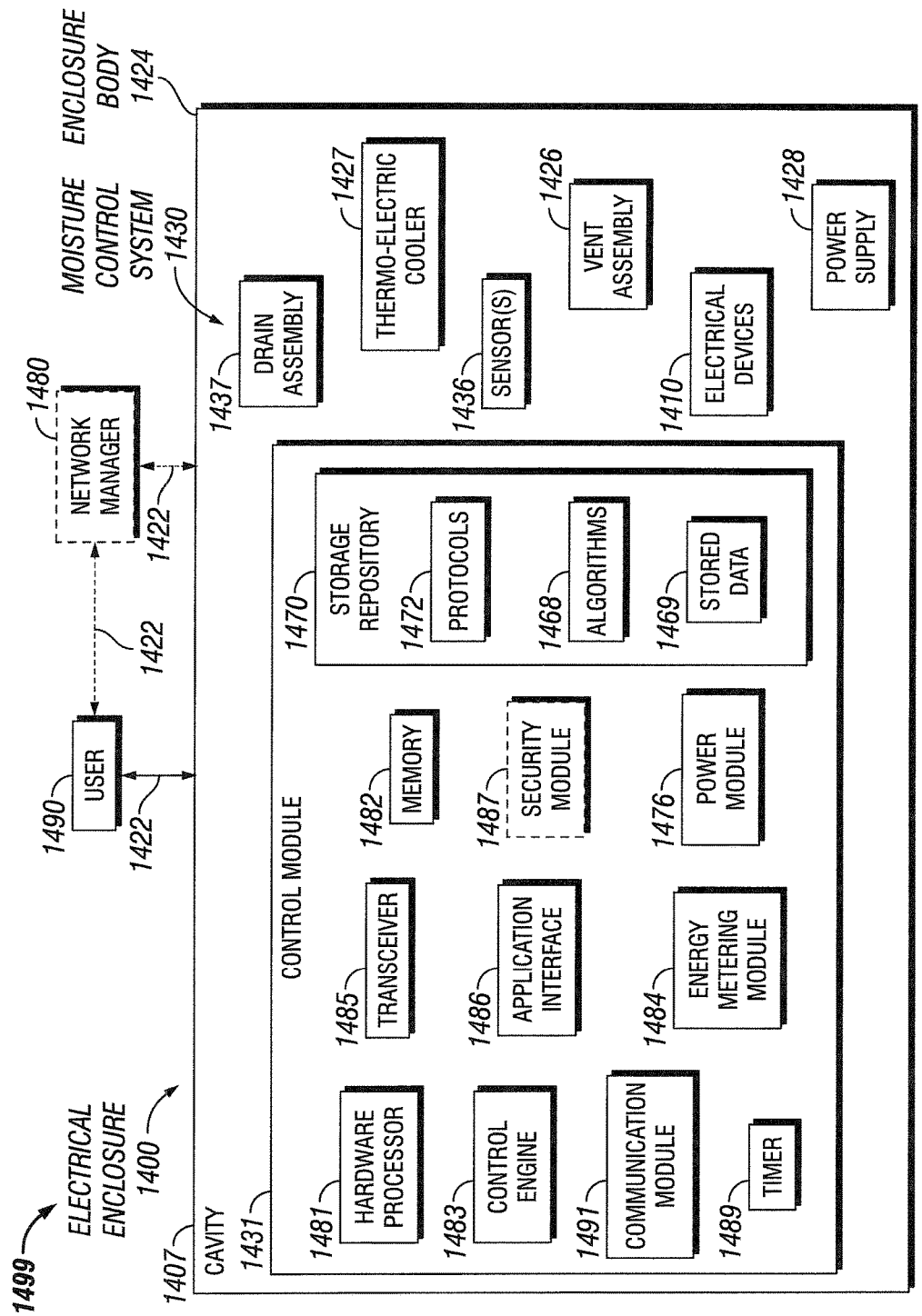
FIG. 14 shows a system diagram that includes a system in accordance with certain example embodiments.

In certain example embodiments, the housing 1333 can be detachably coupled to the drain body 1398. For example, as shown in FIG. 13B, the housing 1333 can be coupled to the drain body 1398 using mating threads 1352. In such a case, the shaft 1344 within the housing 1333 can be joined with the shaft 1344 within the drain body 1398 to form a single shaft 1344. The portion of the shaft 1344 disposed within the drain body 1398 can be coupled to the drain body 1398 using mating threads 1352 or some other coupling features, thereby forming the gap 1347 (flame path 1347), FIG. 14 shows a system diagram that includes a system 1499 in accordance with certain example embodiments. Referring to FIGS. 1-14, in addition to the electrical enclosure 1400, the system 1499 of FIG. 14 can include a user 1490 and an optional network manager 1480. The electrical enclosure 1400 can include one or more electrical devices 1410, a power supply 1428, and a moisture control system 1430. The moisture control system 1430 can include, for example, a control module 1431, a drain assembly 1437, a thermo-electric cooler 1427 (TEC 1427), a vent assembly 1426, and one or more sensors 1436. The control module 1431 can include one or more of a number of components. Such components, can include, but are not limited to, a control engine 1483, a communication module 1491, a timer 1489, a power module 1476, an energy metering module 1484 (also called, more simply, a metering module 1484 herein), a storage repository 1470, a hardware processor 1481, a memory 1482, a transceiver 1485, an application interface 1486, and, optionally, a security module 1487. The components shown in FIG. 14 are not exhaustive, and in some embodiments, one or more of the components shown in FIG. 14 may not be included in an example electrical enclosure 1400. Any component of the example electrical enclosure 1400 can be discrete or combined with one or more other components of the electrical enclosure 1400.

The user 1490 is the same as a user defined above. The user 1490 interacts with (e.g., sends instructions to, sends settings to, receives data from) the electrical enclosure 1400 (including any portions thereof, such as the control module 1431, the sensors 1436) via the application interface 1486 and one or more communication links 1422 (described below). The user 1490 can also interact with a network manager 1480. Interaction between the user 1490 and the electrical enclosure 1400 and/or the network manager 1480 can be conducted using communication links 1422. The communication links 1422 can transmit signals (e.g., electrical power, communication signals, control signals, data) between the electrical enclosure 1400, the user 1490, and the network manager 1480.

The network manager 1480 is a device or component that can communicate with the control module 1431. For example, the network manager 1480 can send instructions to the control module 1431 of the electrical enclosure 1400 as to when a mechanism (e.g., a solenoid) of the drain assembly 1437 should be energized. As another example, the network manager 1480 can receive data associated with the operation of the moisture control system 1430 of the electrical enclosure 1400. Such data can be used for any of a number of purposes, such as determining when maintenance should be performed on the moisture control system 1430 or portions thereof.

The electrical enclosure 1400 can use one or more of a number of communication protocols (a type of protocol 1472). The electrical enclosure 1400 can include and/or be coupled to one or more sensors 1436. A sensor 1436 can be substantially similar to a sensor described above. These sensors 1436 can measure one or more parameters in and/or around the electrical enclosure 1400. Examples of such parameters can include, but are not limited to, temperature, pressure, air quality, air composition, water level, moisture content (for example, for desiccant), and humidity. Examples of a sensor 1436 can include, but are not limited to, thermometer, pressure gauge, a spectrometer, a moisture meter, an oxygen meter, an infrared sensor, and an accelerometer. In some cases, a sensor 1436 can send a parameter, in addition to or in the alternative of measuring a parameter. For example, if a sensor 1436 is a thermometer, then the sensor 1436 can send a signal (for example, to the control module 1431) to indicate the measured temperature at a particular location in the electrical enclosure 1400.

The electrical devices 1410, the TEC 1427, the vent assembly 1426, and the drain assembly 1437 of FIG. 14 can be substantially the same as the electrical devices, the TECs, the vents, and the drains described above. The power supply 1428 of the electrical enclosure 1400 can send power, control, and/or communication signals to the control module 1431, the sensors 1436, the electrical devices 1410, the drain 1437, and/or the TEC 1427. The power supply 1428 can include one or more components. Examples of components of a power supply 1428 can include, but are not limited to, a transformer, a generator, a battery, an electrical receptacle, an electrical cable, an electrical conductor, a fuse, a breaker, and an inductor. The power supply 1428 can be a source of independent power generation. For example, the power supply 1428 can include an energy storage device (e.g., a battery, a supercapacitor). As another example, the power supply 1428 can include photovoltaic solar panels. In addition, or in the alternative, the power supply 1428 can receive power from an independent power supply. The independent power supply can be any source of power that is independent of the power supply 1428. Examples of a power supply can include, but are not limited to, an energy storage device, a step-down transformer, a feed to a building, a feed from a circuit panel, and an independent generation source (e.g., photovoltaic panels, a heat exchanger).

In certain example embodiments, the power supply 1428 sends power, control, and/or communication signals to, and receives power, control, and/or communication signals from, the control module 1431 of the electrical enclosure 1400. In this way, the control module 1431 of the electrical enclosure 1400 can control the amount of power sent by the power supply 1428 to the sensors 1436, the electrical devices 1410, the drain 1437, and/or the TEC 1427.

The control module 1431 of the electrical enclosure 1400 can interact (e.g., periodically, continually, randomly) with the user 1490, the network manager 1480 and/or one or more other components of the moisture control system 143014. The user 1490, the network manager 1480, and/or the other components of the moisture control system 1430 can interact with the control module 1431 of the electrical enclosure 1400 using the application interface 1486 and/or the communication links 1422 in accordance with one or more example embodiments. For example, the application interface 1486 of the control module 1431 can receive data (e.g., information, communications, instructions) from and sends data (e.g., information, communications, instructions) to the user 1490 and the network manager 1480.

The control module 1431, the user 1490, and/or the network manager 1480 can use their own system or share a system in certain example embodiments. Such a system can be, or contain a form of, an Internet-based or an intranet-based computer system that is capable of communicating with various software. A computer system includes any type of computing device and/or communication device, including but not limited to the control module 1431. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 12.

Further, as discussed above, such a system can have corresponding software (e.g., user software, network manager software, control module software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the system 1499.

As discussed above, the electrical enclosure 1400 can include an enclosure body 1424 and an enclosure cover. The enclosure body 1424 can include at least one wall that forms a cavity 1407, and the cavity 1407 becomes enclosed when the enclosure cover couples to the enclosure body 1424. The enclosure body 1424 of the electrical enclosure 1400 can be used to house one or more components (e.g., power supply 1428, sensors 1436, drain 1437, TEC 1427) of the electrical enclosure 1400, including one or more components of the control module 1431. For example, as shown in FIG. 14, the control module 1431 (which in this case includes the control engine 1483, the communication module 1491, the storage repository 1470, the hardware processor 1481, the memory 1482, the transceiver 1485, the application interface 1486, the timer 1489, the energy metering module 1484, the power module 1476, and the optional security module 1487) can be disposed within the cavity 1407 formed by the enclosure body 1424. In alternative embodiments, any one or more of these or other components (or portions thereof) of the electrical enclosure 1400 can be disposed on the enclosure body 1424 and/or remotely from the enclosure body 1424.

The storage repository 1470 can be a persistent storage device (or set of devices) that stores software and data used to assist the control module 1431 in communicating with the user 1490, and the network manager 1480 within the system 1499. In one or more example embodiments, the storage repository 1470 stores one or more protocols 1472 (which can include communication protocols), algorithms 1468, and stored data 1469. The protocols 1472 are generally a process or procedure by which the control module 1431 (or portions thereof) operates under a given set of conditions (e.g., time, readings by sensor 1436, measurements by energy metering module 1484).

When the protocols 1472 are communication protocols, the communication protocols can be any of a number of protocols that are used to send and/or receive data between the control module 1431, the user 1490, and the network manager 1480. One or more of the protocols 1472 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the protocols 1472 can provide a layer of security to the data transferred within the system 1499.

The algorithms 1468 can be any procedures (e.g., a series of method steps), formulas, logic steps, mathematical models, and/or other similar operational procedures that the control engine 1483 of the control module 1431 follows based on certain conditions at a point in time. For example, the control module 1431 can use an algorithm 1469 to measure (using the energy metering module 1484) one or more parameters (e.g., temperature, pressure, humidity) within the cavity 1407 of the electrical enclosure 1400 (as measured by one or more sensors 1436), store (as stored data 1469 in the storage repository 1470) the resulting measurements, and evaluate the stored data 1469 using one or more of the algorithms 1468.

As another example, the control module 1431 can use another algorithm 1468 to continuously monitor the measurements made by the sensors 1436, and use this data to determine the operating parameters of the moisture control system 1430 of the electrical enclosure 1400. As another example, the control module 1431 can use yet another algorithm 1468 to measure one or more parameters of the moisture control system 1430, and use this data to determine whether one or more characteristics (e.g., moisture content, temperature) is within acceptable parameters (also called threshold values, and also part of the stored data 1469).

Stored data 1469 can be any data associated with the electrical enclosure 1400 (including any components thereof), any measurements taken by the sensors 1436, measurements taken by the metering module 1484, time measured by the timer 1489, stored data 1469 (e.g., threshold values, historical measured values), current ratings for the power supply 1428, nameplate information associated with the various components (e.g., electrical devices 1410, drain 1437, TEC 1427, sensors 1436) within the electrical enclosure 1400, performance history of the one or more of the various components within the electrical enclosure 1400, results of previously run or calculated algorithms, and/or any other suitable data. The stored data 1469 can be associated with some measurement of time derived, for example, from the timer 1489.

Examples of a storage repository 1470 can include, but are not limited to, a database (or a number of databases), a file system, a hard drive, flash memory, some other form of solid state data storage, or any suitable combination thereof. The storage repository 1470 can be located on multiple physical machines, each storing all or a portion of the protocols 1472, the algorithms 1468, and/or the stored data 1469 according to some example embodiments. Each storage unit or device can be physically located in the same or in a different geographic location.

The storage repository 1470 can be operatively connected to the control engine 1483. In one or more example embodiments, the control engine 1483 includes functionality to communicate with the user 1490 and the network manager 1480 in the system 1499. More specifically, the control engine 1483 sends information to and/or receives information from the storage repository 1470 in order to communicate with the user 1490 and the network manager 1480. As discussed below, the storage repository 1470 can also be operatively connected to the communication module 1491 in certain example embodiments.

In certain example embodiments, the control engine 1483 of the control module 1431 controls the operation of one or more components (e.g., the communication module 1491, the timer 1489, the transceiver 1485) of the control module 1431. For example, the control engine 1483 can put the communication module 1491 in "sleep" mode when there are no communications between the control module 1431 and another component (e.g., the user 1490) in the system 1499 or when communications between the control module 1431 and another component in the system 1499 follow a regular pattern. In such a case, power consumed by the control module 1431 is conserved by only enabling the communication module 1491 when the communication module 1491 is needed.

As another example, the control engine 1483 can acquire the current time using the timer 1489. The timer 1489 can enable the control module 1431 to control the power supply 1428 (and so also the moisture control system 1430) of the electrical enclosure 1400, even when the control module 1431 has no communication with the user 1490 and/or the network manager 1480. In certain example embodiments, the timer 1489 can track the amount of time that the moisture control system 1430 (including any one or more components thereof) is operating. In such a case, the control engine 1483 can control the power supply 1428 (and so also the moisture control system 1430) based on an amount of time measured by the timer 1489.

In addition to the aspects and capabilities of the control module 1431 described above, the control engine 1483 of the control module 1431 can provide direct or indirect control of any aspect of operation of the moisture control system 1430. For example, the control engine 1483 can control the operation of the electrical devices 1410, the TEC 1427, the drain 1437, the power supply 1428, and/or any other component within the cavity 1407 of the electrical enclosure 1400.

In certain example embodiments, the control engine 1483 can analyze data stored in the storage repository 1470 using one or more algorithms 1468 stored in the storage repository 1470. In this way, the control engine 1483 can provide a historical analysis and/or a predictive analysis to a user 1490 regarding the moisture control system and/or the electrical devices 1410 in the system 1499. In such a case, for example, the control engine 1483 can establish a preventative maintenance program for the electrical enclosure 1400, including any specific components (e.g., the power supply 1428, a component of the moisture control system 1430, the electrical devices 1410) thereof.

The control engine 1483 can provide control, communication, and/or other similar signals to the user 1490 and/or the network manager 1480. Similarly, the control engine 1483 can receive control, communication, and/or other similar signals from the user 1490 and/or the network manager 1480. The control engine 1483 can control the moisture control system 1430 automatically (for example, based on one or more algorithms 1468 and/or protocols 1472 stored in the storage repository 1470) and/or based on control, communication, and/or other similar signals received from a controller (e.g., the network manager 1480) of another component of the system 1499 through the communication links 1422. The control engine 1483 may include a printed circuit board, upon which the hardware processor 1481 and/or one or more discrete components of the control module 1431 can be positioned.

In certain example embodiments, the control engine 1483 can include an interface that enables the control engine 1483 to communicate with one or more components (e.g., communication module 1491) of the electrical enclosure 1400 and/or another component (e.g., the user 1490, the network manager 1480) of the system 1499. Such an interface can operate in conjunction with, or independently of, the protocols 1472 used to communicate between the control module 1431, the user 1490, and/or the network manager 1480.

The control engine 1483 can operate in real time. In other words, the control engine 1483 of the control module 1431 can process, send, and/or receive communications with the user 1490 and the network manager 1480 as any changes (e.g., discrete, continuous) occur within the system 1499. Further, the control engine 1483 of the control module 1431 can, at substantially the same time, control the moisture control system 1430 (including, for example, a sensor 1436, the drain 1437, the TEC 1427), the power supply 1428, and the network manager 1480 based on such changes. In addition, the control engine 1483 of the control module 1431 can perform one or more of its functions continuously. For example, the control module 1431 can continuously use and update protocols 1472 and/or algorithms 1468. As another example, the control module 1431 can continuously control the power supply 1428 of the electrical enclosure 1400. In such a case, any updates or changes can be used by the control module 1431 in adjusting a component of the moisture control system 1430 in real time.

The control engine 1483 (or other components of the control module 1431) can also include one or more hardware and/or software architecture components to perform its functions. Such components can include, but are not limited to, a universal asynchronous receiver/transmitter (UART), a universal synchronous receiver/transmitter (USRT), a serial peripheral interface (SPI), a direct-attached capacity (DAC) storage device, an analog-to-digital converter, an inter-integrated circuit (I$^2$C), and a pulse width modulator (PWM).

In certain example embodiments, the communication module 1491 of the control module 1431 determines and implements the communication protocol (e.g., from the protocols 1472 of the storage repository 1470) that is used when the control engine 1483 communicates with (e.g., sends signals to, receives signals from) the user 1490 and/or the network manager 1480. In some cases, the communication module 1491 accesses the protocols 1472 and/or the algorithms 1468 to determine which communication protocol is within the capability of the recipient of a communication sent by the control engine 1483. In addition, the communication module 1491 can interpret the communication protocol of a communication received by the control module 1431 so that the control engine 1483 can interpret the communication.

The communication module 1491 can send data directly to and/or retrieve data directly from the storage repository 1470. Alternatively, the control engine 1483 can facilitate the transfer of data between the communication module 1491 and the storage repository 1470. The communication module 1491 can also provide encryption to data that is sent by the control module 1431 and decryption to data that is received by the control module 1431. The communication module 1491 can also provide one or more of a number of other services with respect to data sent from and received by the control module 1431. Such services can include, but are not limited to, data packet routing information and procedures to follow in the event of data interruption.

The timer 1489 of the control module 1431 can track clock time, intervals of time, an amount of time, and/or any other measure of time. The timer 1489 can also count the number of occurrences of an event, whether with or without respect to time. Alternatively, the control engine 1483 can perform the counting function. The timer 1489 is able to track multiple time measurements concurrently. The timer 1489 can track time periods based on an instruction received from the control engine 1483, based on an instruction received from the user 1490, based on an instruction programmed in the software for the control module 1431, based on some other condition or from some other component, or from any combination thereof.

The timer 1489 can be configured to track time when there is no power delivered to the control module 1431 (e.g., the power module 1476 malfunctions) using, for example, a super capacitor or a battery backup. In such a case, when there is a resumption of power delivery to the control module 1431, the timer 1489 can communicate any aspect of time to the control module 1431. In such a case, the timer 1489 can include one or more of a number of components (e.g., a super capacitor, an integrated circuit) to perform these functions.

The metering module 1484 of the control module 1431 measures one or more components of energy (e.g., current, voltage, resistance, VARs, watts, gas flow, gas pressure) associated with the electrical enclosure 1400 (including the power supply 1428 and the electrical devices 1410) at one or more points in the system 1499. The metering module 1484 can include any of a number of measuring devices and related devices, including but not limited to a voltmeter, an ammeter, a power meter, an ohmmeter, a current transformer, a potential transformer, a flow meter, a pressure meter, and electrical wiring. The metering module 1484 can measure a component of energy continuously, periodically, based on the occurrence of an event, based on a command received from the control engine 1483, based on measurements captured by the sensors 1436, and/or based on some other factor.

The power module 1476 of the control module 1431 provides power to one or more other components (e.g., timer 1489, control engine 1483) of the control module 1431. In certain example embodiments, the power module 1476 receives power from the power supply 1428. The power module 1476 can include one or more of a number of single or multiple discrete components (e.g., transistor, diode, resistor), and/or a microprocessor. The power module 1476 may include a printed circuit board, upon which the microprocessor and/or one or more discrete components are positioned. In some cases, the power module 1476 can include one or more components that allow the power module 1476 to measure one or more elements of power (e.g., voltage, current) that is delivered to and/or sent from the power module 1476.

The power module 1476 can include one or more components (e.g., a transformer, a diode bridge, an inverter, a converter) that receives power (for example, through an electrical cable) from a source (e.g., the power supply 1428) and generates power of a type (e.g., alternating current, direct current) and level (e.g., 12V, 24V, 120V) that can be used by the other components of the control module 1431. The power module 1476 can use a closed control loop to maintain a preconfigured voltage or current with a tight tolerance at the output. The power module 1476 can also protect the rest of the electronics (e.g., hardware processor 1481, transceiver 1485) from surges generated in the line. In addition, or in the alternative, the power module 1476 can be a source of power in itself to provide signals to the other components of the control module 1431. For example, the power module 1476 can be a battery. As another example, the power module 1476 can be a localized photovoltaic power system.

The hardware processor 1481 of the control module 1431 executes software in accordance with one or more example embodiments. Specifically, the hardware processor 1481 can execute software on the control engine 1483 or any other portion of the control module 1431, as well as software used by the user 1490 and/or the network manager 1480. The hardware processor 1481 can be an integrated circuit, a central processing unit, a multi-core processing chip, a multi-chip module including multiple multi-core processing chips, or other hardware processor in one or more example embodiments. The hardware processor 1481 is known by other names, including but not limited to a computer processor, a microprocessor, and a multi-core processor.

In one or more example embodiments, the hardware processor 1481 executes software instructions stored in memory 1482. The memory 1482 includes one or more cache memories, main memory, and/or any other suitable type of memory. The memory 1482 is discretely located within the control module 1431 relative to the hardware processor 1481 according to some example embodiments. In certain configurations, the memory 1482 can be integrated with the hardware processor 1481.

In certain example embodiments, the control module 1431 does not include a hardware processor 1481. In such a case, the control module 1431 can include, as an example, one or more field programmable gate arrays (FPGA). As another example, the control module 1431 can include one or more integrated circuits (ICs). Using FPGAs, ICs, and/or other similar devices known in the art allows the control module 1431 (or portions thereof) to be programmable and function according to certain logic rules and thresholds without the use of a hardware processor.

The transceiver 1485 of the control module 1431 can send and/or receive control and/or communication signals. Specifically, the transceiver 1485 can be used to transfer data between the control module 1431, the user 1490, and the network manager 1480. The transceiver 1485 can use wired and/or wireless technology. The transceiver 1485 can be configured in such a way that the control and/or communication signals sent and/or received by the transceiver 1485 can be received and/or sent by another transceiver that is part of the user 1490 and/or the network manager 1480.

When the transceiver 1485 uses wireless technology as the communication link 1422, any type of wireless technology can be used by the transceiver 1485 in sending and receiving signals. Such wireless technology can include, but is not limited to, Wi-Fi, visible light communication, cellular networking, and Bluetooth. The transceiver 1485 can use one or more of any number of suitable communication protocols (e.g., ISA100) when sending and/or receiving signals. Such communication protocols can be dictated by the communication module 1491. Further, any transceiver information for the user 1490 and/or the network manager 1480 can be stored in the storage repository 1470.

Optionally, in one or more example embodiments, the security module 1487 secures interactions between the control module 1431, the user 1490, and the network manager 1480. More specifically, the security module 1487 authenticates communication from software based on security keys verifying the identity of the source of the communication. For example, user software may be associated with a security key enabling the software of the user 1490 to interact with the control module 1431 and/or the network manager 1480. Further, the security module 1487 can restrict receipt of information, requests for information, and/or access to information in some example embodiments.

Figure 15:
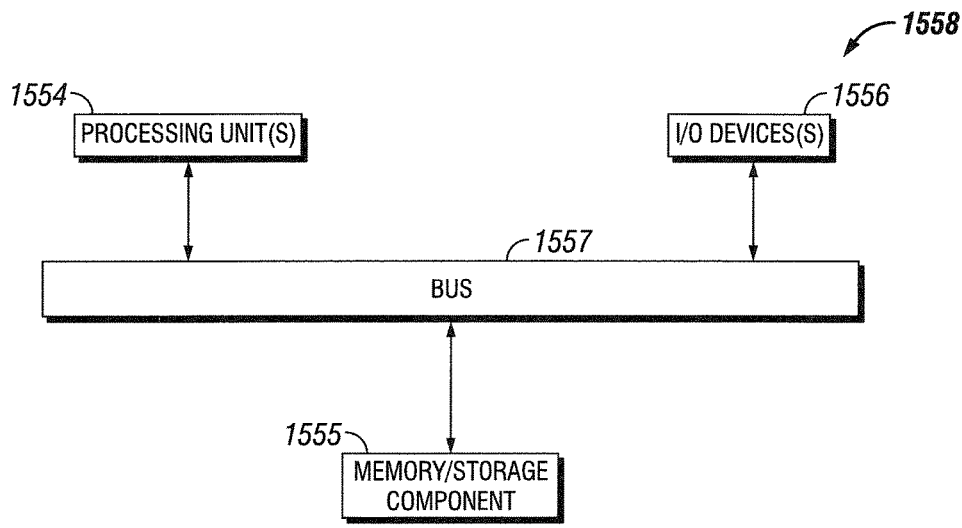
FIG. 15 shows a computing device in accordance with one or more example embodiments.

One or more of the functions performed by any of the components (e.g., control module 1431) of an example moisture control system 1430 can be performed using a computing device 1558. An example of a computing device 1558 is shown in FIG. 15. The computing device 1558 implements one or more of the various techniques described herein, and which is representative, in whole or in part, of the elements described herein pursuant to certain example embodiments. Computing device 1558 is one example of a computing device and is not intended to suggest any limitation as to scope of use or functionality of the computing device and/or its possible architectures. Neither should computing device 1558 be interpreted as having any dependency or requirement relating to any one or combination of components illustrated in the example computing device 1558.

Computing device 1558 includes one or more processors or processing units 1554, one or more memory/storage components 1555, one or more input/output (I/O) devices 1556, and a bus 1557 that allows the various components and devices to communicate with one another. Bus 1557 represents one or more of any of several types of bus structures, including a memory bus or memory controller, a peripheral bus, an accelerated graphics port, and a processor or local bus using any of a variety of bus architectures. Bus 1557 includes wired and/or wireless buses.

Memory/storage component 1555 represents one or more computer storage media. Memory/storage component 1555 includes volatile media (such as random access memory (RAM)) and/or nonvolatile media (such as read only memory (ROM), flash memory, optical disks, magnetic disks, and so forth). Memory/storage component 1555 includes fixed media (e.g., RAM, ROM, a fixed hard drive, etc.) as well as removable media (e.g., a Flash memory drive, a removable hard drive, an optical disk, and so forth).

One or more I/O devices 1556 allow a customer, utility, or other user to enter commands and information to computing device 1558, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 1558 is connected to a network (not shown) (e.g., a local area network (LAN), a wide area network (WAN) such as the Internet, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 1558 includes at least the minimal processing, input, and/or output means necessary to practice one or more embodiments.

Further, those skilled in the art will appreciate that one or more elements of the aforementioned computer device 1558 is located at a remote location and connected to the other elements over a network in certain example embodiments. Further, one or more embodiments is implemented on a distributed system having one or more nodes, where each portion of the implementation (e.g., control module 1431) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Figure 16:
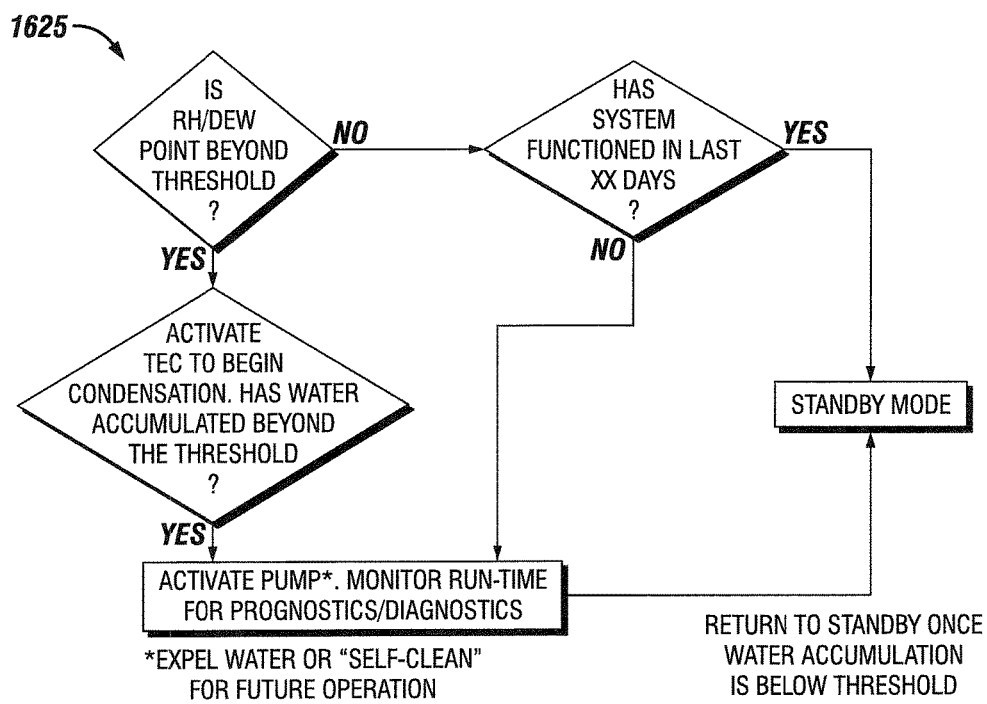
FIG. 16 shows a flowchart of a method for controlling moisture within an electrical enclosure in accordance with certain example embodiments.

FIG. 16 shows a flowchart of a method 1625 for controlling moisture in a cavity (e.g., cavity 907) of an electrical enclosure (e.g., electrical enclosure 900) using an example moisture control system (e.g., moisture control system 930). While the various steps in this flowchart are presented and described sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order. In addition, a person of ordinary skill in the art will appreciate that additional steps not shown in FIG. 16, may be included in performing this method. Accordingly, the specific arrangement of steps should not be construed as limiting the scope.

In addition to the example embodiments described above, or in the alternative to the example embodiments described above, example moisture control systems for electrical enclosures can include one or more of a number of other mechanisms, components, and/or devices. For example, humidity within the cavity of an electrical enclosure can be controlled using an inert material with an automatic renew cycle. In such a case, a unit within the cavity of the electrical enclosure can house a desiccant (e.g., silica gel). The system can also include a heater, a cold plate, and an air moving device. The air moving device can circulate air within the cavity of the electrical enclosure over the desiccant, which can be heated by the heater. The heater can operate if the humidity of the air within the cavity of the electrical enclosure exceeds a threshold value. When this occurs, the cold plate can condense the moisture, and the resulting condensation can be collected and removed (e.g., drained, pumped out) from the cavity of the electrical enclosure.

Figure 17:
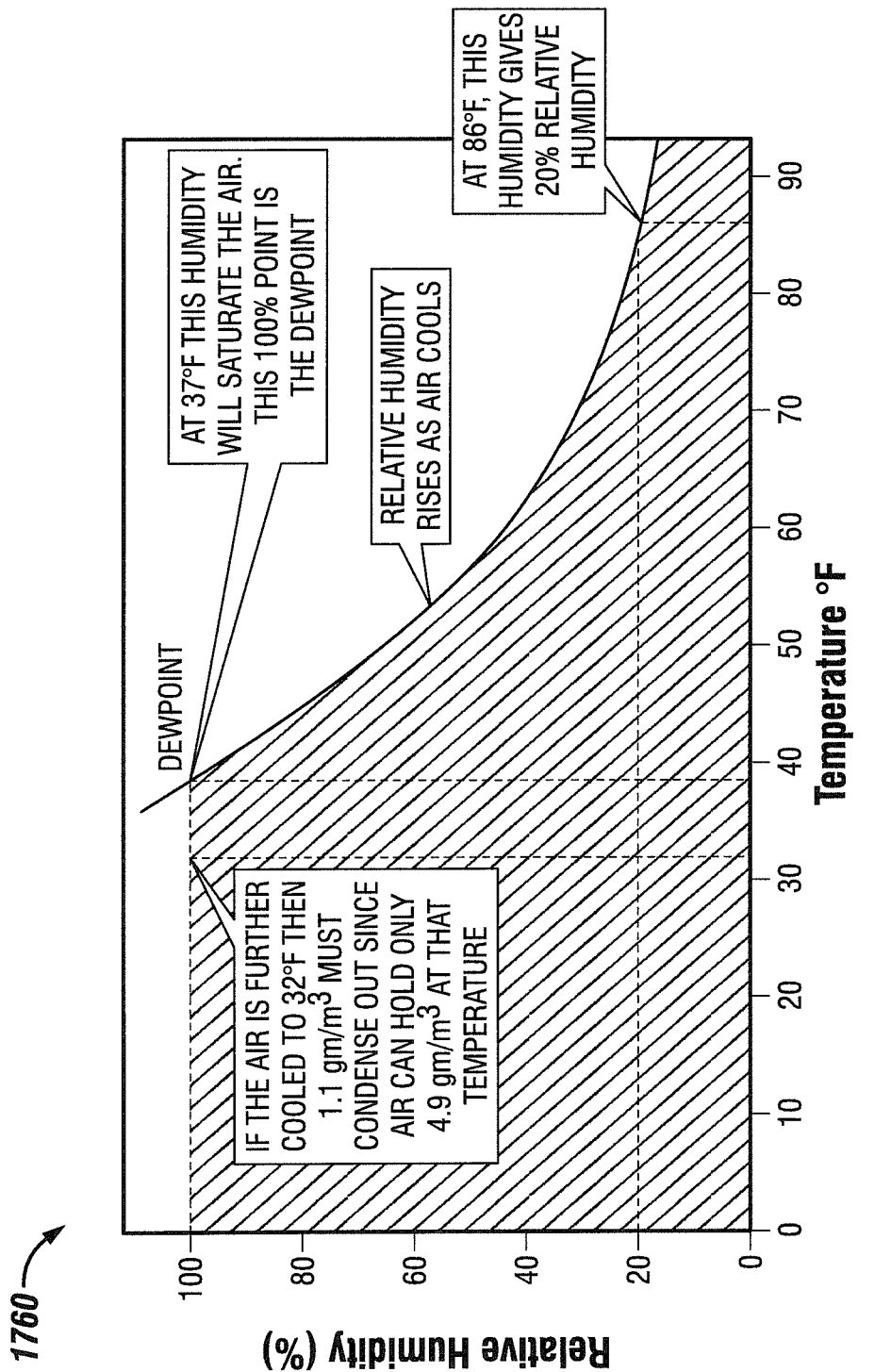
FIG. 17 shows a chart of the relationship between relative humidity and temperature.

As another example, the cavity of the electrical enclosure can be heated above a threshold value (e.g., the dew point). One or more barriers (e.g., gore-tex) can be inserted into a drain and/or used with a sintered filter so that the humidity within the cavity of the electrical enclosure is lower than the humidity of the ambient air. In addition, or in the alternative, the barrier can help control one or more other conditions within the electrical enclosure. A dehumidifier can be disposed within the cavity of the electrical enclosure to control the moisture within the cavity of the electrical enclosure. The dehumidifier can take on one or more of a number of forms. Examples of a dehumidifier can include, but are not limited to, a cold plate and a hot plate placed in series with respect to each other, and one or more Peltier cooling plates. The collected moisture can then be removed (e.g., drained, pumped out) from the cavity of the electrical enclosure. As the following chart 1760 of FIG. 17 shows, the dew point (relative humidity) can be controlled by controlling the temperature within the cavity of the electrical enclosure, and vice-versa.

As yet another example, the internal conditions (e.g., temperature, humidity) of an electrical enclosure can be controlled by preparing the external surfaces of the electrical enclosure. The preparation of the external surfaces of the electrical enclosure can vary, based on a number of factors, including but not limited to the climate in which the electrical enclosure is placed. For example, an electrical enclosure placed in predominately cold temperatures can be painted or otherwise coated in black or some other dark color to absorb heat, increasing the temperature of the cavity within the electrical enclosure. As another example, an electrical enclosure placed in predominately high temperatures (e.g., a desert) can be painted or otherwise coated in white or some other light color to reflect heat, decreasing the temperature of the cavity within the electrical enclosure. As another example, an electrical enclosure can be covered with an insulating material (e.g., a radiant barrier) to reduce thermal swings within the electrical enclosure.

As still another example, a moisture control system can include an automatic desiccant dispensing system. In this case, the desiccant (e.g., silica gel) can be fed into a storage container outside the electrical enclosure. The moisture control system can automatically dispense a quantity of the desiccant from the storage container into the electrical enclosure. Similarly, after some period of time, the moisture control system can automatically retrieve the spent desiccant from within the electrical enclosure and put it in a separate container outside the electrical enclosure.

As yet another example, the moisture control system of an electrical enclosure can include a vacuum (e.g., similar to a shop-vac) that be run periodically within one or more portions of the interior of the electrical enclosure. As still another example, a moisture control system can include a specially-engineered organism (e.g., bacteria) that consumes water or other forms of moisture and expels air and/or some other compound that does not affect the condition that the moisture control system is designed to control.

As yet another example, a moisture control system can include a molecular sieve that is regenerated periodically using heat from a heater. As still another example, a special coating can be used on some or all of the inner surfaces of the cover and the enclosure body of the electrical enclosure. Such a coating can be designed to absorb some amount (e.g., approximately 1200% of its weight) of water and other forms of moisture.

Example embodiments provide for moisture control systems for electrical enclosures. Specifically, certain example embodiments allow for a variety of systems that control one or more conditions (e.g., moisture, temperature) within an electrical enclosure. Example moisture control systems for electrical enclosures allow the climate within the cavity of an electrical enclosure to be regulated. For example, example moisture control systems can reduce moisture and/or temperatures within a cavity of an electrical enclosure. Example embodiments can allow an electrical enclosure to comply with applicable standards (e.g., NEMA 4X enclosure, NEMA 7 enclosure) and/or regulations. In some cases, example embodiments can operate automatically and can provide predictive maintenance scheduling assistance. In some cases, example moisture control systems can operate without electricity.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A moisture control system for an electrical enclosure, wherein the moisture control system comprises:
   a controller; and
   a drain assembly coupled to the controller, wherein the drain assembly is disposed, at least in part, within a cavity formed by the electrical enclosure, wherein the drain assembly comprises:
   a plurality of drain assembly components that forms a path for removing liquid from within the cavity to an ambient environment outside the electrical enclosure; and
   an electro-mechanical device disposed outside the path, wherein the controller is configured to operate the drain assembly in an active cleaning mode by cycling the drain assembly for the purpose of maintaining clearance in the path to allow the liquid to traverse the path from within the cavity to the ambient environment outside the electrical enclosure.

2. The moisture control system of claim 1, further comprising:
   at least one sensor coupled to the controller, wherein the at least one sensor measures at least one parameter within the cavity of the electrical enclosure, wherein the controller operates the drain assembly based on the at least one parameter measured by the at least one sensor.

3. The moisture control system of claim 1, wherein the drain assembly further comprises at least one drain solenoid, wherein the controller selectively provides power to the at least one drain solenoid to operate the drain assembly between a closed drain state and an open drain state.

4. The moisture control system of claim 3, wherein the at least one drain solenoid of the drain assembly comprises two drain solenoids that form a push-pull configuration for a shaft of the drain assembly.

5. The moisture control system of claim 1, further comprising:
   a vent assembly coupled to the controller, wherein the vent assembly is disposed, at least in part, within the cavity of the electrical enclosure, wherein the vent assembly is configured to allow ambient air to flow therethrough to the cavity, thereby reducing a pressure within the cavity, wherein the controller operates the vent assembly between a closed vent state and an open vent state.

6. The moisture control system of claim 5, further comprising:
   at least one sensor coupled to the controller, wherein the at least one sensor measures at least one parameter within the cavity of the electrical enclosure, wherein the controller operates the vent assembly based on the at least one parameter measured by the at least one sensor.

7. The moisture control system of claim 5, wherein the vent assembly comprises at least one vent solenoid, wherein the controller selectively provides power to the at least one vent solenoid to operate the vent assembly between the closed vent state and the open vent state.

8. The moisture control system of claim 1, further comprising:
   a thermo-electric cooler (TEC) disposed against a thermally conductive component within the cavity of the electrical enclosure, wherein the TEC is coupled to the controller, wherein the TEC operates to alter at least one parameter within the cavity.

9. The moisture control system of claim 8, wherein the at least one parameter comprises at least one selected from a group consisting of a dew point, a temperature, and a humidity, and wherein the TEC operates, based on instructions from the controller, to lower the at least one parameter, at least locally, of the thermally conductive component within the cavity of the electrical enclosure.

10. The moisture control system of claim 9, wherein the thermally conductive component, when cooled by the TEC, promotes formation of the liquid within the cavity of the electrical enclosure.

11. The moisture control system of claim 10, further comprising:
    at least one sensor coupled to the controller, wherein the at least one sensor measures the at least one parameter within the cavity of the electrical enclosure, wherein the controller operates the TEC based on the at least one parameter measured by the at least one sensor.

12. The moisture control system of claim 1, wherein the controller comprises:
    a hardware processor;
    a memory that stores a plurality of instructions; and
    a control engine that executes the plurality of instructions using the hardware processor to operate the electro-mechanical device of the drain assembly.

13. The moisture control system of claim 12, wherein the controller further comprises a plurality of algorithms, wherein the controller operates in one of a plurality of modes using the plurality of algorithms.

14. An electrical enclosure comprising:
    an enclosure body that forms a cavity;
    an enclosure cover coupled to the enclosure body, wherein the enclosure cover, when coupled to the enclosure body, encloses the cavity; and
    a moisture control system disposed, at least in part, within the cavity, wherein the moisture control system controls at least one condition within the cavity of the electrical enclosure, wherein the moisture control system comprises:
    a controller; and
    a drain assembly coupled to the controller, wherein the drain assembly is disposed, at least in part, within the cavity of the electrical enclosure, wherein the drain assembly comprises:
    a plurality of drain assembly components that forms a path for removing liquid from within the cavity to an ambient environment outside the electrical enclosure; and
    an electro-mechanical device disposed outside the path, wherein the controller is configured to operate the drain assembly in an active cleaning mode by cycling the drain assembly for the purpose of maintaining clearance in the path from within the cavity to the ambient environment.

15. The electrical enclosure of claim 14, wherein the ambient environment is a hazardous environment.

16. The electrical enclosure of claim 15, wherein a portion of the drain assembly forms a flame path that complies with at least one standard applicable to the enclosure body and the enclosure cover, when coupled to each other, in the hazardous environment.

17. The electrical enclosure of claim 14, further comprising:
- at least one electrical device disposed within the cavity, wherein the at least one electrical device is vulnerable to an abnormal level of the at least one condition.

18. The electrical enclosure of claim 14, further comprising:
- a power supply that provides power to the controller and the drain assembly.

19. The electrical enclosure of claim 14, wherein the controller is configured to communicate with a network manager to report a status of the moisture control system.

* * * * *